United States Patent [19]
Nishizawa et al.

[11] Patent Number: 5,342,480
[45] Date of Patent: Aug. 30, 1994

[54] METHOD OF MANUFACTURING A SEMICONDUCTOR INTEGRATED CIRCUIT DEVICE

[75] Inventors: Hirotaka Nishizawa, Kokubunji; Seiichiro Azuma, Ohme; Takayuki Yoshitake, Fussa; Kuzuo Tanaka, Tokyo; Mikinori Kawaji, Hino; Sinmei Hirano, Iruma; Toshio Yamada, Hamura; Yasusi Sekine, Ohme, all of Japan

[73] Assignees: Hitachi, Ltd., Tokyo; Hitachi VLSI Engineering Corp., Kodaira, both of Japan

[21] Appl. No.: 69,844

[22] Filed: Jun. 1, 1993

[30] Foreign Application Priority Data

Jun. 5, 1992 [JP] Japan .................................. 4-145192

[51] Int. Cl.$^5$ ...................... H01L 21/306; B44C 1/22
[52] U.S. Cl. .................................. 156/648; 156/651; 156/657; 156/661.1; 156/662; 437/41; 437/67
[58] Field of Search ............... 156/643, 648, 651, 657, 156/659.1, 661.1, 662; 437/41, 67, 72, 73, 78

[56] References Cited

U.S. PATENT DOCUMENTS

| | | | |
|---|---|---|---|
| 4,396,460 | 8/1983 | Tamaki et al. | 156/653 |
| 4,657,630 | 4/1987 | Agatsuma | 156/643 |
| 4,892,614 | 6/1990 | Chapman et al. | 156/648 X |
| 5,256,592 | 10/1993 | Matsushita | 437/67 |

OTHER PUBLICATIONS

Kurosawa et al., A new Bird's-Beak Free Field Isolation Technology for VLSI Devices, IEDM, 1981, pp. 384-387.

Primary Examiner—William Powell
Attorney, Agent, or Firm—Antonelli, Terry, Stout & Kraus

[57] ABSTRACT

An isolation and flattening technique for a semiconductor substrate having active devices, such as a bipolar transistor, and a MISFET, formed thereon, is disclosed. The technique includes forming grooves, to the main surface of a non-active region of a semiconductor substrate or a semiconductor layer, each groove extending into the substrate or layer and forming island regions of the substrate or layer, forming a burying material and a first mask having an etching rate greater than that of the burying material successively over the entire surface of the semiconductor substrate or the semiconductor layer including areas on the upper surface of the island regions and in the grooves, such that the film thickness is made virtually uniform for each of the surfaces, forming a second mask on the surface of the first mask, through which the region on each of the island regions is exposed and in which the end of the opening is situated from the end of the island region to the outside of the island region within a distance 0.7 times of the film thickness for the sum of the burying material and the first mask, and applying isotropic etching successively to each of the first mask and the burying material by using the second mask as an etching mask, under a condition in which the etching rate for the first mask is greater than that for the burying material.

4 Claims, 18 Drawing Sheets

FIG. 10

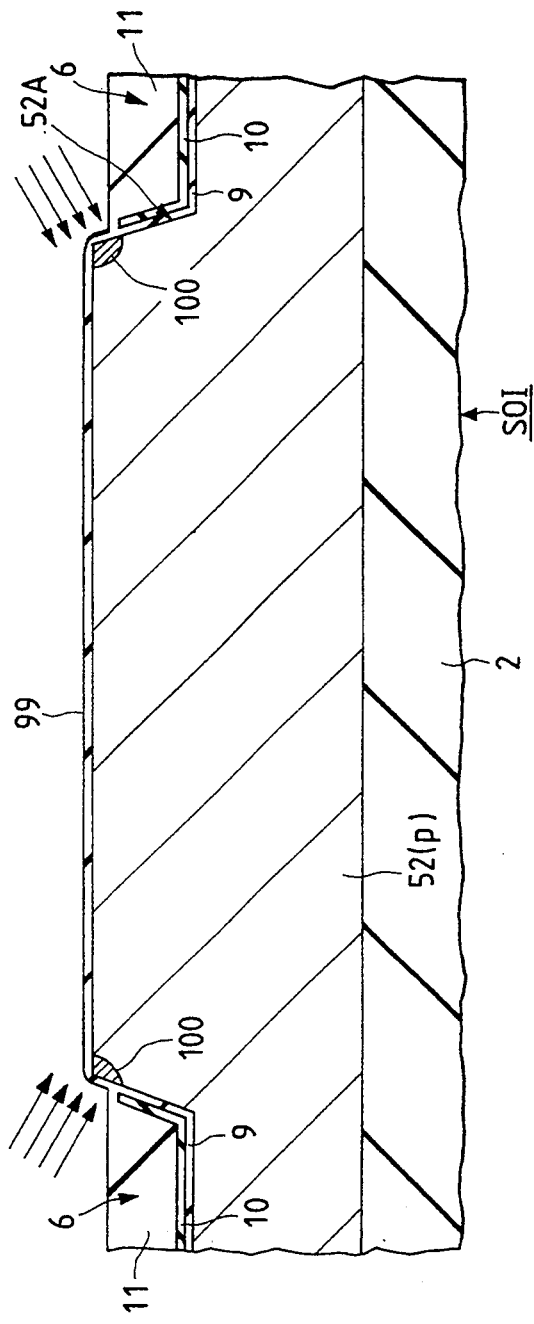
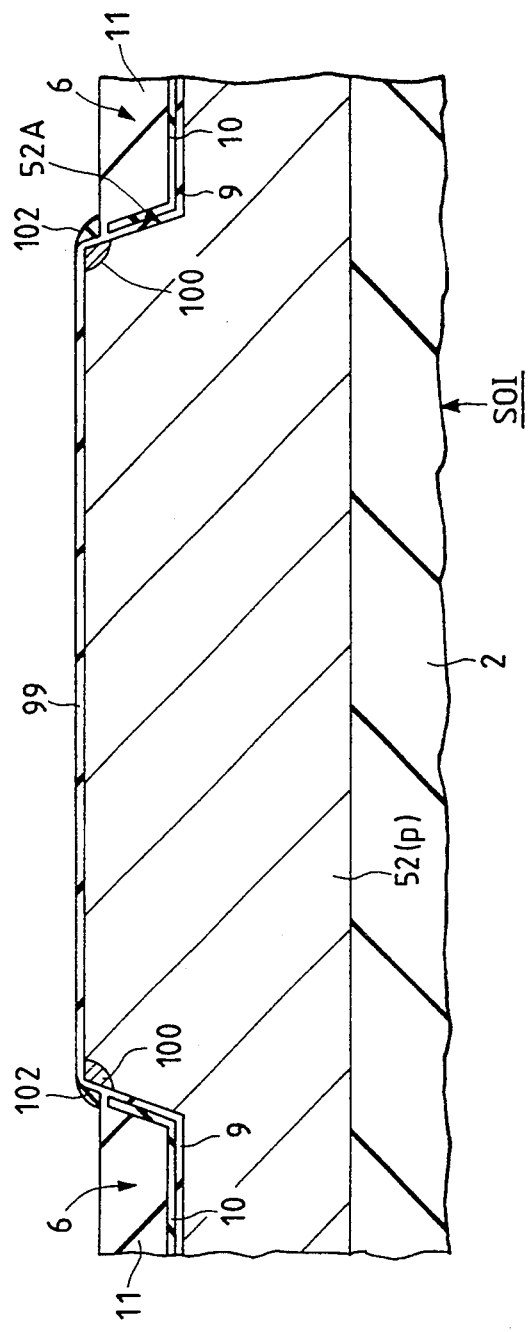

METHOD OF MANUFACTURING A SEMICONDUCTOR INTEGRATED CIRCUIT DEVICE

BACKGROUND OF THE INVENTION

The present invention concerns a semiconductor integrated circuit device and, more in particular, it relates to a technique effective to the application of a semiconductor integrated circuit device in which a burying material is buried in grooves formed in a non-active region, and island regions (active regions) each defined at the periphery thereof with the grooves are insulated and isolated from each other.

As a technique for insulating and isolating active regions forming devices from each other in a semiconductor integrated circuit device, there has been known, for example, a BOX (Burled Oxide Isolation) technique of burying a burying material in grooves formed in a non-active region and insulating and isolating active regions each defined at the periphery thereof with the grooves from each other as described, for example, in IEDM Tech. Dig. 384 (1981), Kei KUROSAWA, et al, "A NEW BIRD'S-BEAK FREEFIELD ISOLATION TECHNOLOGY FOR VLSI DEVICES". In the BOX technology, the burying material is buried portionwise for twice in the grooves so as to flatten the inactive and active regions.

Description will now be made simply for the process of the BOX technology.

For example, a silicon oxide film and an aluminum film are successively stacked at first on a main surface of a silicon substrate, patterning is successively applied to each of them and a first mask (silicon oxide film) is formed on a main surface of the active region of the silicon film and a second mask (aluminum film) is formed on the first mask, respectively.

Then, using the second mask as an etching mask, etching is applied to the inactive region of the silicon substrate by means of an anisotropic etching such as RIE to form grooves extended from the surface of the substrate in the direction of the depth thereof and form island regions each defined at the periphery thereof with the grooves in the active region.

Then, a silicon oxide film is formed by deposition, for example, by a plasma CVD process on the entire surface of the silicon substrate including the portions on the grooves and on the island region, and the inside of the groove is buried with the silicon oxide film (first burying material).

Then, the silicon oxide film deposited to the side wall in the groove is removed by a buffer HF solution. Subsequently, by using a lift off method, the second mask is removed and, at the same time, the silicon oxide film on the second mask is removed.

Then, a silicon oxide film is formed by deposition, for example, by a plasma CVD process on the entire surface of the substrate including the portions on the grooves and on the island regions, to bury the inside of the grooves again with the silicon oxide film (second burying material). Subsequently, a photoresist is coated on the silicon oxide film by a rotary coating method, and a baking treatment is applied to form a photoresist film. The thickness of the photoresist film is formed to a thickness substantially equal with that of the silicon oxide film.

Then, anisotropic etching such as RIE is applied to each of the photoresist film and the polycrystalline silicon film under such a condition that the etching speed is substantially equal between the photoresist film and the polycrystalline silicon film, and etching back is applied till reaching the mask 1. Thus, the burying materials (first burying material, second burying material) can be buried to the inside of the grooves of the inactive region.

SUMMARY OF THE INVENTION

The prevent inventors have made a study on the BOX technology as described above and found the following problems.

In the BOX technology, the second burying material is buried in the groove formed in the inactive region to form a silicon oxide film and etching back is applied after forming a photoresist film on the silicon oxide film.

Since the photoresist film is coated by a rotary coating method, fluctuation is caused to the thickness of the wafer between the central portion and the peripheral portion thereof. In addition, fluctuation is caused to the thickness of the photoresist film due to the dependency on the underlying pattern caused by dense regions and coarse regions of island regions. In the silicon oxide film as the burying material, since a plurality of wafers are treated with the batchwise treatment, fluctuation is caused for the film thickness on every wafers, and fluctuation is also caused to the film thickness between the central portion and the peripheral portion of the wafer. Further, in the etching back treatment for etching each of the photoresist film and the silicon oxide film, it is desirable that the etching is completed at a position of the upper surface of the island region, but over etching is applied inevitably. Therefore there is a problem that a step is caused between a position at the surface of the burying material buried in the grooves and a position at the upper surface of the island region, so that no sufficient flattening can be attained.

Further, in a case of forming MOSFET in the island region, both ends of a gate electrode of MOSFET are led out from a portion on the island region to a portion on the burying material with the gate insulation film being interposed therebetween. Therefore, if there is such a step that the position at the surface of the burying material is lower as compared with the position at the upper surface of the island region, since a field effect is caused from two positions, i.e., on the side of the upper surface and the lateral side of the island region at the ends of the island region in the lateral direction of the gate of MOSFET, there is a problem that the threshold voltage of the MOSFET fluctuates.

An object of the present invention is to provide a technique capable of attaining such a flattening in which a position for the upper surface of the island region and a position at the surface of the burying material on the side of the island region are substantially aligned with each other.

Another object of the present invention is to provide a technique capable of reducing the fluctuation of a threshold voltage of MISFET formed on a main surface of the island region.

These and other objects, as well as novel features of the present invention will become apparent by referring to the descriptions of the specification and the appended drawings.

Among the inventions disclosed in the present application, description will be made simply for the outline of typical inventions as described below.

A method of manufacturing a semiconductor integrated circuit device of forming grooves to a main surface of a non-active region of a semiconductor substrate or the semiconductor layer, forming island regions each defined at the periphery thereof by the grooves to the main surface of the active region of the semiconductor substrate or semiconductor layer and insulating and isolating the island regions from each other by a burying material buried in grooves, comprises the following steps (a) through (d):

(a) a step of forming grooves to the main surface of the non-active region of the semiconductor substrate or the semiconductor layer, each groove extending from the surface to the direction of the depth thereof and forming island regions each defined at the periphery thereof with the grooves to the main surface of the active region of the semiconductor substrate or the semiconductor layer, (b) a step of forming a burying material and a first mask having an etching rate greater as compared with that of the burying material successively over the entire surface of the semiconductor substrate or the semiconductor layer including portions on the upper surface of the island regions, on the lateral sides and the bottoms of the grooves, such that the film thickness is made virtually uniform for each of the surfaces, (c) a step of forming a second mask on the surface of the first mask, through which the region on each of the island regions is opened and in which the end of the opening is situated from the end of the island region to the outside of the island region within a distance 0.7 times of the film thickness for the sum of the burying material and the first mask, and (d) a step of applying isotropic etching successively to each of the first mask and the burying material by using the second mask as an etching mask, under a condition in which the etching rate for the first mask is greater as compared with that for the burying material.

Further, in a method of manufacturing a semiconductor integrated circuit device as described above, the step of forming the grooves to the non-active region of the semiconductor substrate or the semiconductor layer comprises a step of forming the grooves by applying anisotropic etching to the main surface of the non-active region of the semiconductor substrate or the semiconductor layer by using a third mask formed on the main surface of the active region of the semiconductor substrate or the semiconductor layer as an etching mask and, subsequent to the step of forming the grooves, introducing an impurity at a higher concentration as compared with an impurity concentration of the semiconductor substrate or the semiconductor layer to the main surface of the semiconductor substrate or the semiconductor layer at the bottom of the grooves by using the third mask as an impurity introduction mask, thereby forming a semiconductor region.

Further, in a method of manufacturing a semiconductor integrated circuit device as described above, the step of forming the semiconductor region to the main surface of the semiconductor substrate or the semiconductor layer at the bottom of the grooves comprises a step of introducing an impurity at a higher concentration as compared with that in the semiconductor substrate or the semiconductor layer to the main surface of the semiconductor substrate or the semiconductor layer at the bottom of the grooves, then applying an extending diffusion treatment to the impurity at high concentration and joining the high concentration impurity in the island regions.

Further, in a method of manufacturing a semiconductor integrated circuit device of forming grooves to a main surface of an inactive region of a semiconductor substrate or a semiconductor layer, forming island regions each defined at the periphery thereof by the grooves to the main surface of the active region of the semiconductor substrate or the semiconductor layer and then insulating and isolating the island regions from each other by a burying material buried in the grooves comprises the following steps (e) through (i):

(e) a step of forming an insulating film on the upper surface and the lateral side of the island regions such that the film thickness is made substantially uniform to each of the surfaces, (f) a step of forming a semiconductor region by introducing an impurity of a conduction type identical with that of the semiconductor substrate or the semiconductor layer and at a higher concentration as compared with the impurity concentration therein to the main surface of the semiconductor substrate or the semiconductor layer at a shoulder region where the lateral side and the upper surface of the island region intersects, at an angle inclined relative to the upper surface of the island region, through the insulating film by using an ion implantation method, and (i) a step of forming MISFET to the main surface of the semiconductor region or the semiconductor layer at the upper surface of the island regions.

According to the present invention, in the step of applying isotropic etching to each of the first mask and the burying material by using the second mask as the etching mask, the first mask is at first etched in the region within the opening of the second mask in the direction of the depth (vertical direction), and side etching (lateral etching) to the first mask covered with the second mask is started. Then, the burying material is etched in the region within the opening of the second mask in the direction of the depth, and side etching to the burying material covered with the second mask is started. Then, an etchant is supplied by way of a region in which the second mask was previously removed by the side etching, and the burying material covered with the second mask is etched in the direction of the depth. That is, the burying material on the island region is etched and, at the same time, the burying material formed to a large apparent thickness along the step is etched by so much as the film thickness of the burying material on the island region and, finally, the burying material on the island region is removed and the burying material on the shoulder (corner) of the island region is removed. As a result, the burying material can be buried in the groove and flattening can be attained such that a position on the upper surface of the island region and a position or the surface of the burying material on the side of the island region are substantially aligned.

Further, according to the present invention, since the semiconductor region at a concentration higher than the concentration of the impurity of the semiconductor substrate or the semiconductor layer can be formed, at the bottom of the groove on the main surface of the semiconductor substrate or the semiconductor region, the resistance value of the semiconductor substrate or the semiconductor layer can be decreased.

Furthermore, according to the present invention, since the semiconductor region at a high concentration can be formed at a position isolated from the surface of the island region by the depth of the groove, a buried type semiconductor region can be formed without forming an epitaxial growing layer. As a result, since the step of forming the epitaxial layer can be discussed the number of steps for manufacturing the semiconductor integrated circuit device can be decreased by so much as the manufacturing step.

Furthermore, according to the present invention, since the impurity introduced by the ion implantation method, is introduced at an angle nearly equal to a right angle on the side of the peripheral side than at the upper surface of the island region, the amount of the impurity introduced through the insulating film to the lateral side of the island region is greater as compared with the amount of the impurity introduced through the insulating film to the upper surface of the island region. As a result, since the impurity can be introduced selectively to the end at a concentration higher than that of the channel forming region along the end that defines the gate width of the island region, it is possible to increase the threshold voltage at the end in the lateral direction of the gate of the island region, thereby decreasing the fluctuation of the threshold voltage of MISFET.

BRIEF DESCRIPTION OF THE DRAWINGS

FIG. 10 is a fragmentary cross sectional view of a semiconductor integrated circuit device having a bipolar transistor of a vertical structure as Example 2 according to the present invention;

FIG. 16 is a fragmentary cross sectional view for explaining a method of manufacturing MISFET to be mounted on a semiconductor integrated circuit device as Example 4 according to the present invention;

FIG. 17 is a fragmentary cross sectional view illustrating a modified embodiment of Example 4;

DESCRIPTION OF THE PREFERRED EMBODIMENTS

Figure 1:
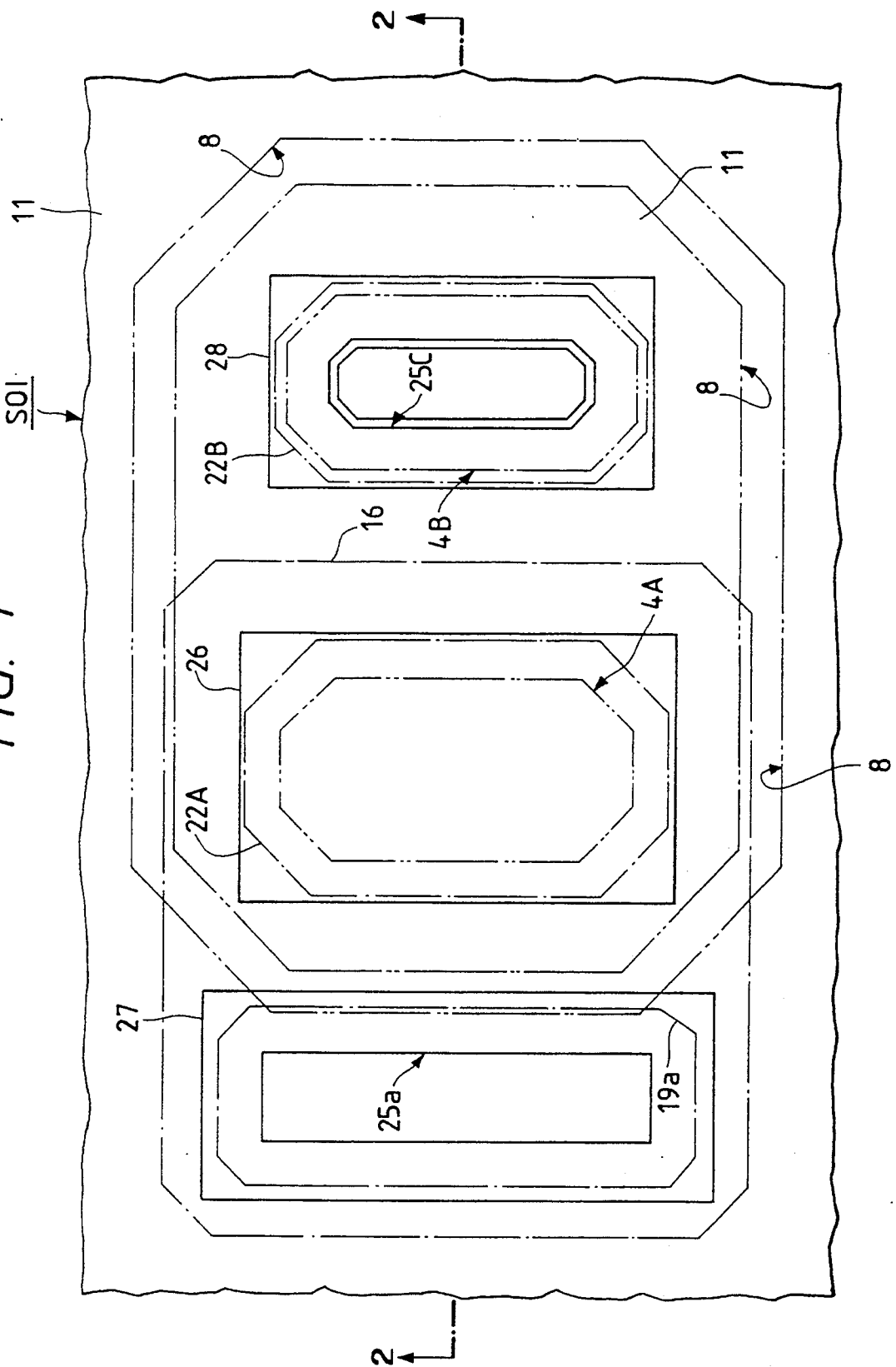
FIG. 1 is a fragmentary plan view of a semiconductor integrated circuit device having a bipolar transistor as an Example 1 according to the present invention.

Descriptions will now be made to the constitution of the present invention with reference to examples.

In all of the drawings for explaining the examples, those having identical functions carry the same reference numerals, for which duplicate explanations will be omitted.

EXAMPLE 1

This example is a first embodiment of the present invention in which the invention is applied to a semiconductor integrated circuit device having a bipolar transistor of a vertical structure.

Figure 2:
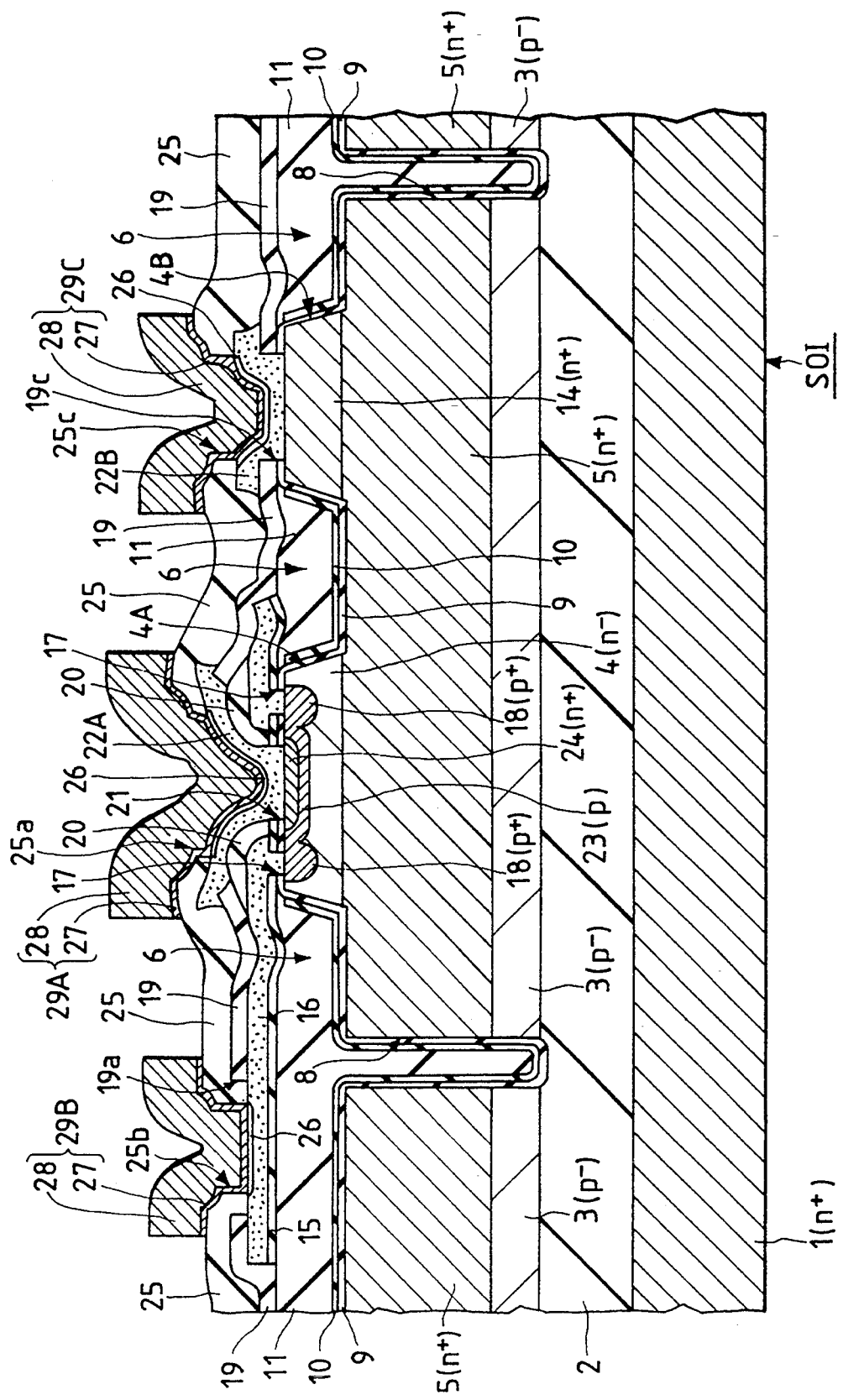
FIG. 2 is a fragmentary cross sectional view taken along line A—A in FIG. 1.
Figure 3:
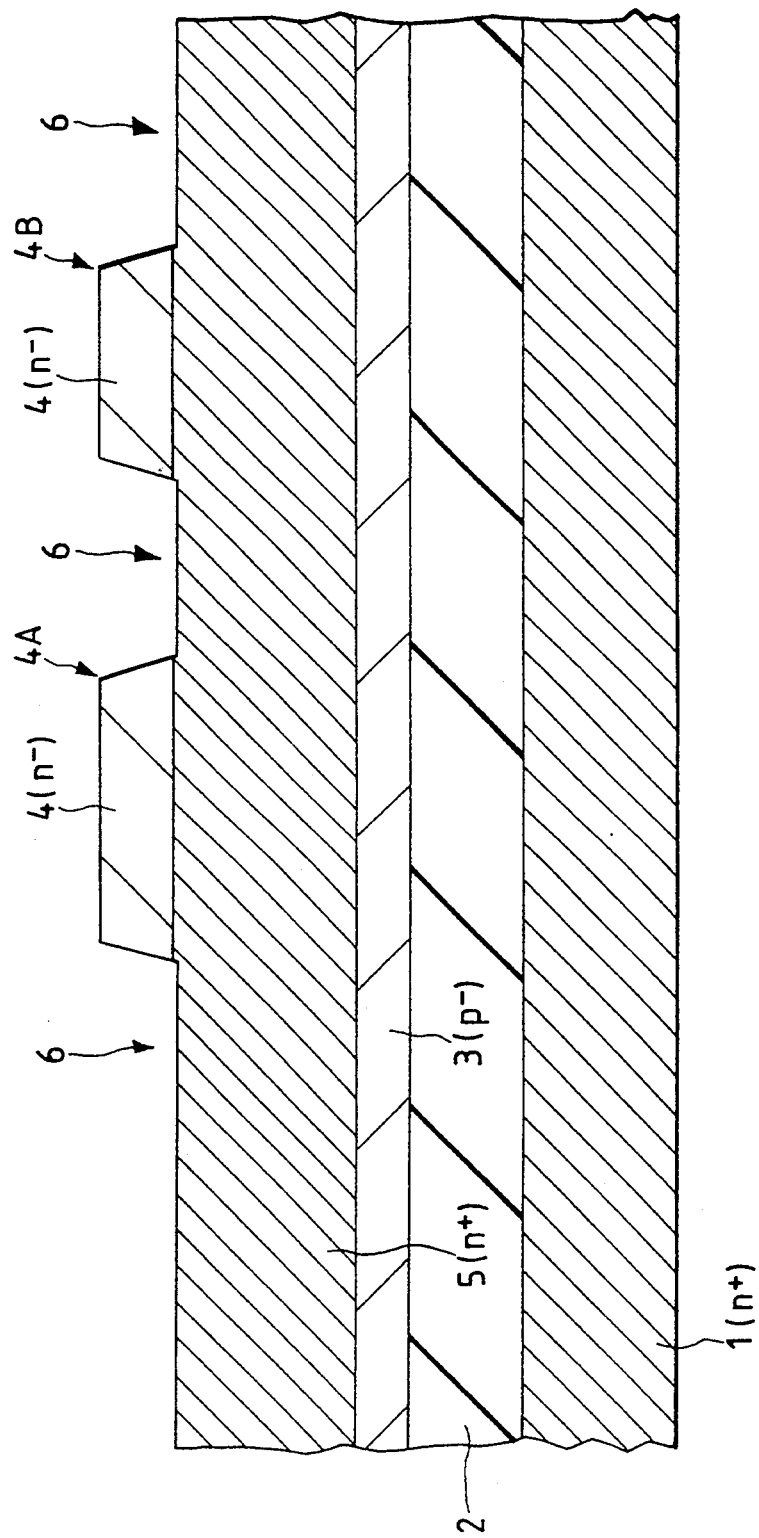
FIG. 3 is a fragmentary cross sectional view of the semiconductor integrated circuit device in a first manufacturing step.

A schematic constitution of a semiconductor integrated circuit device having a bipolar transistor of a vertical structure as Example 1 according to the present invention is shown in FIG. 1 (fragmentary plan view) and in FIG. 2 (Fragmentary cross sectional view taken along line A—A in FIG. 1).

As shown in FIGS. 1 and 2, a semiconductor integrated circuit device having a bipolar transistor of a vertical structure mainly comprises an SOI (Silicon On Insulator) substrate having an SOI structure. The SOI substrate has a constitution in which a p-type semiconductor substrate 3, for example, made of single crystal silicon is laminated by way of an insulating film 2 on a main surface of a base substrate 1. The base substrate 1 is formed, for example, with an $n^+$ type semiconductor substrate made of single crystal silicon with an aim of improving α-ray resistance. The insulating film 2 is formed, for example, with a thermally oxidized silicon oxide film. An n-type epitaxial layer 4 grown by an epitaxial growing method is formed on the main surface of the p-type semiconductor substrate 3. A burying type $n^+$ type semiconductor region 5 is formed between the $n^-$-epitaxial layer 4 and the p-semiconductor substrate 3.

A bipolar transistor of a vertical structure is formed to a main surface of an active region of the SOI substrate. The bipolar transistor of the vertical structure is formed as an npn type by arranging each of n type emitter region, p type base region and n type collector region successively from the surface of the $n^-$-epitaxial layer 4 formed on the main surface of the $p^-$-semiconductor substrate 3 toward the direction of the depth thereof.

The n-collector region comprises an intrinsic collector region, a graft collector region and an $n^+$-semiconductor region 14 for pulling up collector potential. The intrinsic collector region is formed to an island region (protruding island region) 4A formed in an active region of the n⁻-epitaxial layer 4. That is, the intrinsic collector region is constituted with the n⁻-epitaxial layer 4. The graft collector region comprises the burying type n+-semiconductor region 5 formed between the p-semiconductor substrate 3 and the n⁻-epitaxial layer 4. The burying type n+-semiconductor region 5 is surrounded at the periphery thereof with a trench grooves each extending from the surface in the direction of the depth thereof as far as the insulating film 2 and electrically isolated from other burying type n+-semiconductor region 5. The n+-semiconductor region 14 for pulling up the collector potential is formed to an island region (protruding island region) 4B formed in an active region of the n⁻-epitaxial layer 4. The n+-semiconductor region 14 is in contact and electrically connected with the burying type n+-semiconductor region 5 which is the graft collector region.

The n+-semiconductor region 14 for pulling up the collector potential is connected through a collector opening 19c with a collector potential pulling up electrode 22B. The collector potential pulling up electrode 22B is formed, for example, with a polycrystalline silicon film introduced with an n type impurity for reducing the resistance, value. The collector potential pulling up electrode 22B is connected through a connection hole 25c formed in an interlayer insulating film 25 to a collector electrode 29C. The collector electrode 29C is made of a composite film comprising a barrier metal layer 27 and an aluminum alloy film 28 deposited thereon. The barrier metal layer 27 is formed, for example, with a titanium nitride film. The aluminum alloy film 28 is formed, for example, with an Al—Cu—Si alloy film as a countermeasure to migration. Further, a platinum silicide film 26, for instance, is formed between the collector potential pulling up electrode 22B and the barrier metal layer 27 with a purpose of reducing the contact resistance.

The p-base region is constituted with an intrinsic base region and a graft base region. The intrinsic base region comprises a p-semiconductor region 23. The p-semiconductor region 23 is formed to a main surface of the n⁻-epitaxial layer 4 within a region defined by the island region 4A. The graft base region is constituted with a p+-semiconductor region 18. The p+-semiconductor region 18 is formed on a main surface of the n⁻-epitaxial layer 4 within the region defined by the island region 4A, and a portion thereof is in contact and electrically connected with a p-semiconductor region 23.

One end of a base leading electrode 16 on the side of an emitter is connected through a base opening 17 to the p+-semiconductor region 18 as the graft base region. The base leading electrode 16 is formed, for example, with a polycrystalline silicon film introduced with a p-impurity for reducing the resistance value. The base leading electrode 16 is so constituted as to define the periphery of an emitter opening 21 at one end thereof. The other end of the base leading electrode 16 is connected through a connection hole 25b formed in an interlayer insulating film 26 with a base electrode 29B. The base electrode 29B is formed by the same manufacturing step as that for the collector electrode 29C. A platinum silicide film 26 is formed between the barrier metal layer 27 of the base electrode 29B and the base leading electrode 16. An opening 19a is formed in the interlayer insulating film 19 is formed below the base electrode 29B.

Each of the p+-semiconductor region 18 as the graft base region and the p-semiconductor region 23 as the intrinsic base region is formed by self-alignment with one end of the base leading electrode 16 on the side of the emitter.

The n-emitter region is constituted with an n+-semiconductor region 24. The n+-semiconductor region 24 is formed to the main surface of the p-semiconductor region 23 as the intrinsic base region and formed by self alignment with one end of the base leading electrode 16 on the side of the emitter. An emitter leading electrode 22A is connected through an emitter opening 21 to the n+-semiconductor region 24 as the n-emitter region. The emitter leading electrode 22A is formed, for example, with a polycrystalline silicon film introduced, for example, with an n-impurity for reducing the resistance value and it is formed by the same manufacturing step as that for the collector potential pulling up electrode 22B. The emitter opening 21 is formed in a region defined with the interlayer insulating film 20 formed on the surface at one end of the base pulling up electrode 16 on the side of the emitter and it is formed by self alignment with the base leading electrode 16. The interlayer insulating film 20 electrically isolates the base leading electrode 16 and the emitter leading electrode 22A.

The emitter leading electrode 22A is connected through a connection hole 25a formed in the interlayer insulating layer film 25 with an emitter electrode 29A. The emitter electrode 29A is formed by the same manufacturing step as that for the collector electrode 29C. A platinum silicide film 26 is formed between the barrier metal layer 27 of the emitter electrode 29A and the emitter leading electrode 22A.

Each of the island region 4A and the island region 4B is formed in a non-active region of the n⁻-epitaxial layer 4 by forming a groove 6 which extends from the surface of the n⁻-epitaxial layer 4 in the direction of the depth as far as the n+-semiconductor region 5. The groove 6 is formed, for example, by anisotropic etching. An insulating film 9, an insulating film 10 and a burying material 11 are buried successively in the groove 6. In the same way, the insulating film 9, the insulating film 10 and the burying material 11 are successively buried in a trench groove 8. The burying material 11 is formed, for example, with a silicon oxide film. Namely, each of the island region 4A and the island region 4B is defined at the periphery thereof with the grooves 6 and electrically isolated by the burying material 11 or the like from other active regions. That is, the bipolar transistor of the vertical structure mounted on the semiconductor integrated circuit device is defined at the periphery thereof with isolation regions comprising, for example, the p⁻-semiconductor substrate 3, the trench groove 8 and the burying material 11, and electrically isolated from other active regions.

The surface of the burying material 11 is formed at a position substantially identical with the position for the upper surface of each of the island region 4A and the island region 4B. That is, the burying material 11 burled in the groove 6 moderates the step between the groove 6 and each of the island region 4A and the island region 4B thereby attaining flattening to the upper surface of each of the island region 4A and the island region 4B.

Description will now be made briefly to a method of manufacturing a semiconductor integrated circuit device having the bipolar transistor of the vertical structure with reference to FIG. 3 through FIG. 9 (fragmentary cross sectional views illustrated on every manufacturing steps).

At first, an SOI substrate having an SOI structure is prepared. The SOI substrate in this embodiment has a constitution in which the p⁻-semiconductor substrate 3 made of single crystal silicon is laminated by way of the insulating film 4 on the main surface of the base substrate 1 formed with the n⁺-semiconductor substrate made of single crystal silicon. An n⁻-epitaxial layer 4 is formed to the main surface of the p⁻-semiconductor substrate 3, and a buried type n⁺-semiconductor region 5 is formed between the n⁻-epitaxial layer 4 and the p⁻-semiconductor substrate 3.

Then, in the active region of the SOI substrate, a mask (not illustrated) is formed on the main surface of the n⁻-epitaxial layer 4. Subsequently, anisotropic etching is applied to the main surface of the non-active region of the n⁻-epitaxial layer 4 by using the mask as an etching mask, to form grooves 6 each extending from the surface of the n⁻-epitaxial layer 4 in the direction of the depth thereof as far as the burying type n⁺ type semiconductor region 5, as well as form each of the island region 4A and the island region 4B defined at the periphery thereof with the grooves. The groove 6 is formed to a depth greater than the thickness of the n⁻-epitaxial layer 4. The anisotropic etching is applied, for example, by dry etching. Then, the mask is removed.

Figure 4:
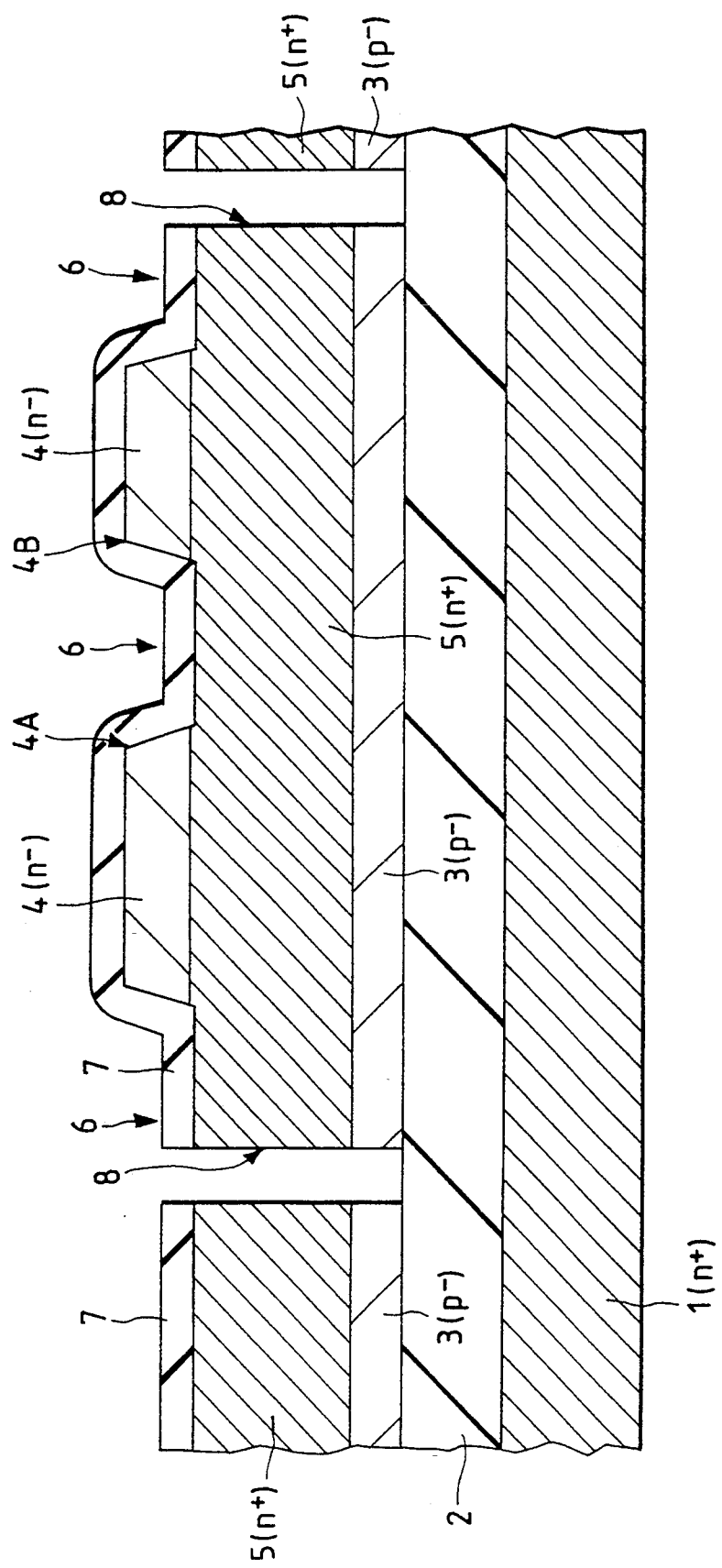
FIG. 4 is a fragmentary cross sectional view of the semiconductor integrated circuit device in a second manufacturing step.
Figure 5:
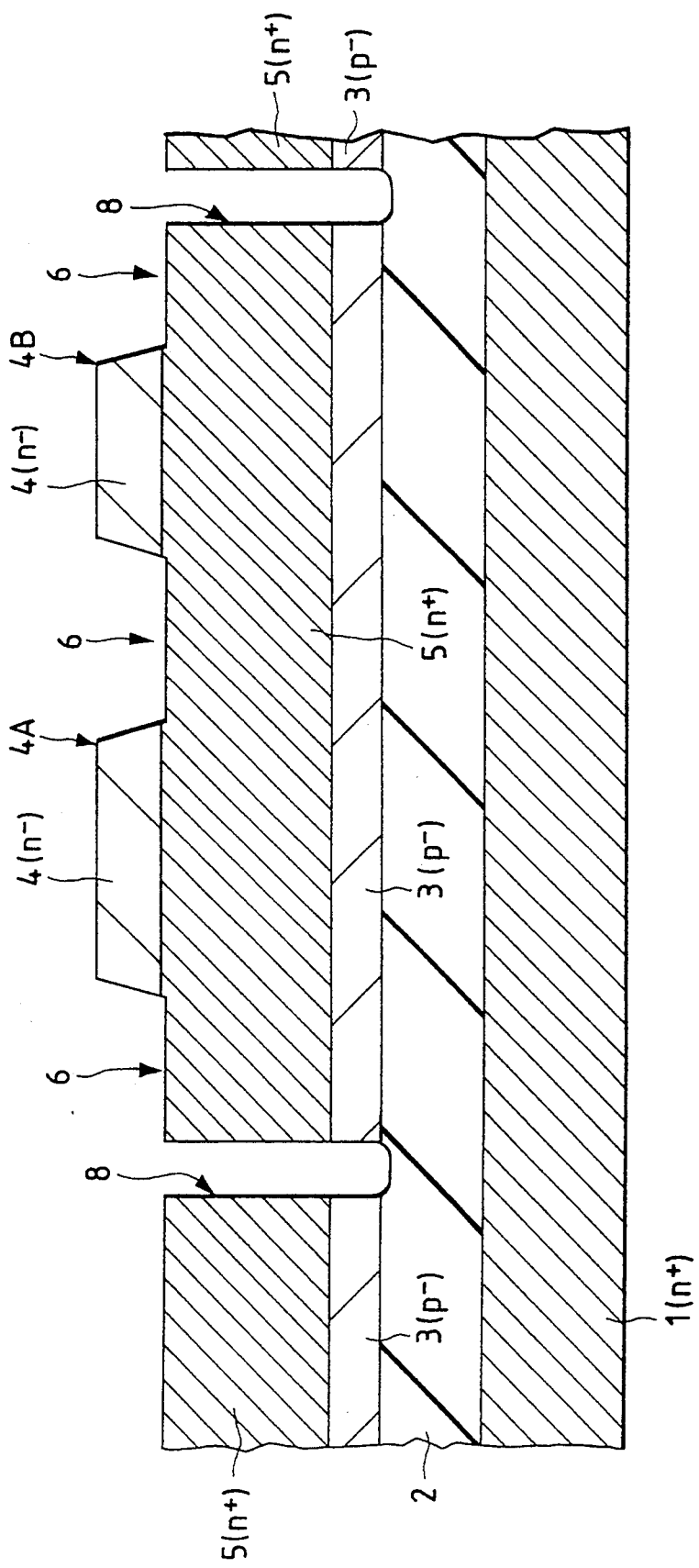
FIG. 5 is a fragmentary cross sectional view of the semiconductor integrated circuit device in a third manufacturing step.

Then, a polycrystalline silicon film is formed over the entire surface of the substrate including areas on the island region 4A and the island region 4B, and patterning is applied to trench isolation regions of the polycrystalline silicon film, to form a mask 7. The polycrystalline silicon film is formed, for example, by a high temperature low pressure CVD process using monosilane as a source gas and it is formed, for example, to a thickness of about 300 (nm). Subsequently, patterning is applied by anisotropic etching, using the mask 7 as the etching mask to form trench grooves 8 each extending from the bottom of the groove 6 in the direction of the depth as far as the insulating film 2 as shown in FIG. 4.

Then, the mask 7 is removed by wet etching. In this case, the surface of the insulating film 2 exposed in the trench groove 8 is also etched slightly.

Figure 6:
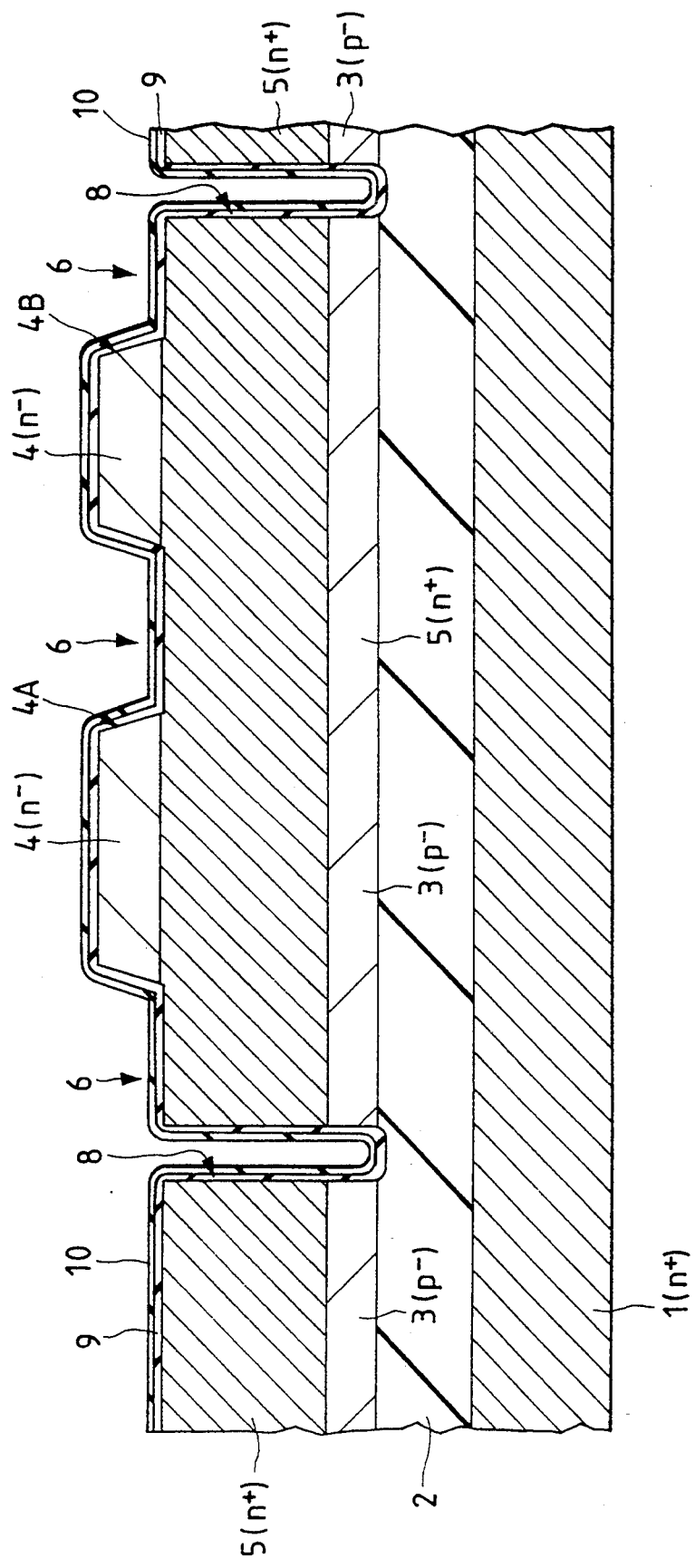
FIG. 6 is a fragmentary cross sectional view of the semiconductor integrated circuit device in a fourth manufacturing step.

Then, as shown in FIG. 6, an insulating film 9 and an insulating film 10 are successively deposited over the entire surface of the substrate including areas on the surface of each of the island region 4A and the island region 4B, on the lateral side of the groove 6 (on the lateral sides for each of the island regions 4A and 4B) and on the bottom of the groove 6. In this case, the insulating film 9 and the insulating film 10 are successively deposited also in the trench groove 8. The insulating film 9 is formed, for example, with a silicon oxide film deposited by a plasma CVD process using tetraethoxysilane as a source gas, and it is formed to a film thickness, for example, of about 50 (nm). The insulating film 10 is formed, for example, with a silicon nitride film deposited by a CVD process, and it is formed to a film thickness, for example, of about 50 (nm).

Then, a burying material 11 is formed over the entire surface of the substrate including areas on the upper surface of each of the island region 4A and the island region 4B, on the lateral side of the groove 6 and on the bottom of the groove 6 such that the film thickness is substantially uniform for each of the surfaces. The burying material 11 is formed also in the trench groove 8. The burying material 11 is formed with a silicon oxide film deposited by a plasma CVD process using tetraethoxysilane as a source gas and it is formed to a thickness, for example, of about 700 (nm). The silicon oxide film is applied with an oxidizing treatment such as wet oxidation after the deposition to improve the film quality in which the wet etching rate to the buffer etching solution is made substantially equal with that for the film quality of the thermally oxidized silicon film.

Then, a mask (first mask) 12 having a wet etching rate higher than that of the burying material 11 is formed over the entire surface of the burying material 11. The mask 12 is formed, for example, with a silicon oxide film deposited by a high temperature, low pressure CVD process using monosilane as a source gas and it is formed to a film thickness, for example, of about 30 (nm). The mask 12 is formed at a wet etching rate greater by about 1.4 to 2.0 times than that for the burying material 11. In this example, 1.8 times of wet etching rate ratio which is nearly equal with $\pi/2$ is used. The wet etching rate ratio can be controlled by changing the heat treatment after forming the mask 12.

Figure 7:
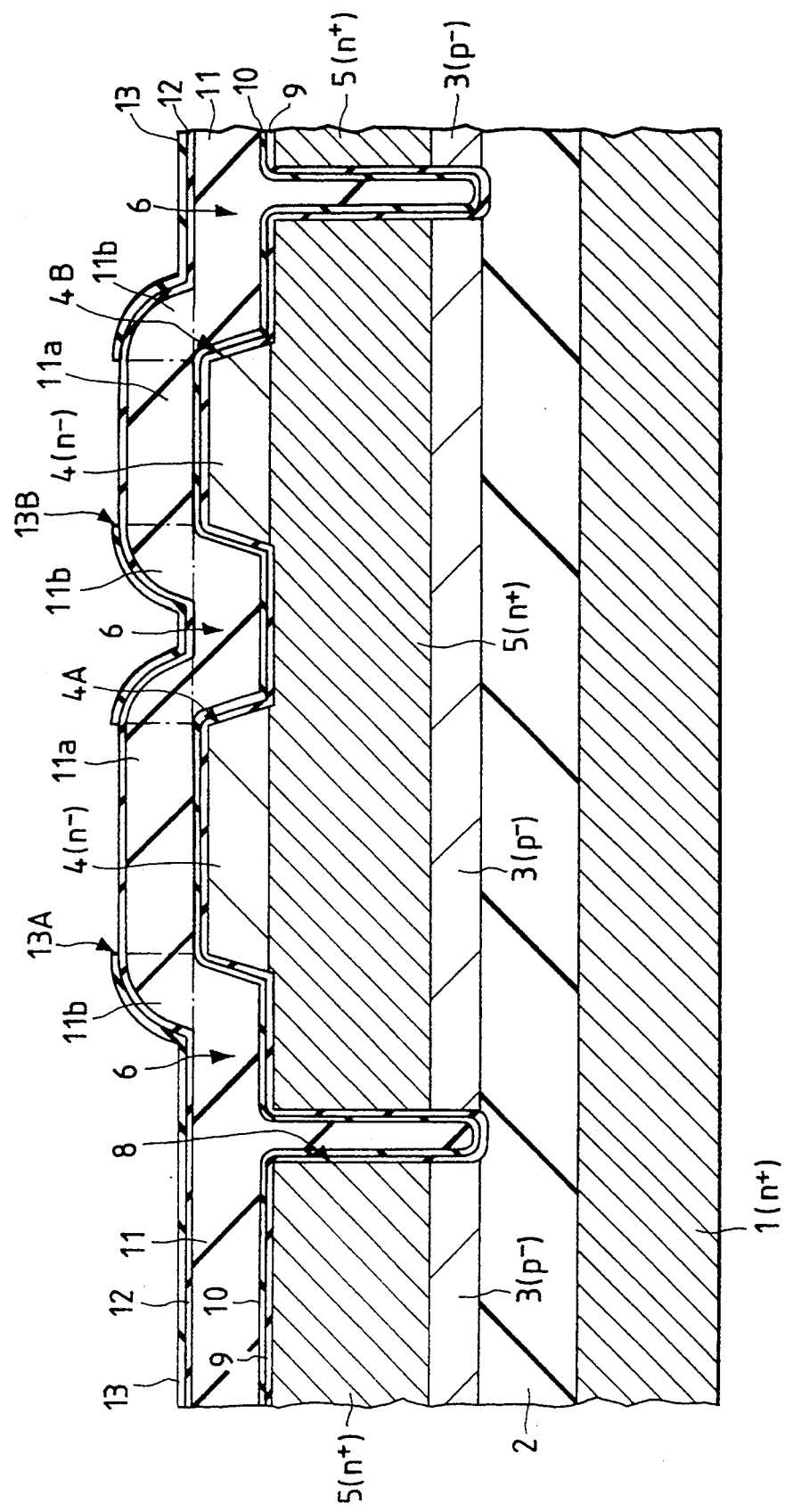
FIG. 7 is a fragmentary cross sectional view of the semiconductor integrated circuit device in a fifth manufacturing step.

Then, as shown in FIG. 7, a mask (second mask) 13 having each of an opening 13A and an opening 13B through which each of the regions on the island region 4A and the island region 4B is formed on the surface of the mask 12. The opening end of the opening 13A in the mask 13 situates within a distance 0.7 times the film thickness for the sum of the burying material 11 and the mask 12 from the end of the island region 4A (shoulder at which the lateral side and the upper surface of the island region 4A intersect) to the out side of the island region 4A. In the same way, the opening end of the opening 13B in the mask 13 situates within a distance 0.7 times the film thickness for the sum of the burying material 11 and the mask 12 from the end of the island region 4B to the out side of the island region 4B. The mask 13 is formed, for example, with a silicon nitride film deposited by a CVD process and it is formed to a film thickness, for example, of about 50 (nm).

Figure 8:
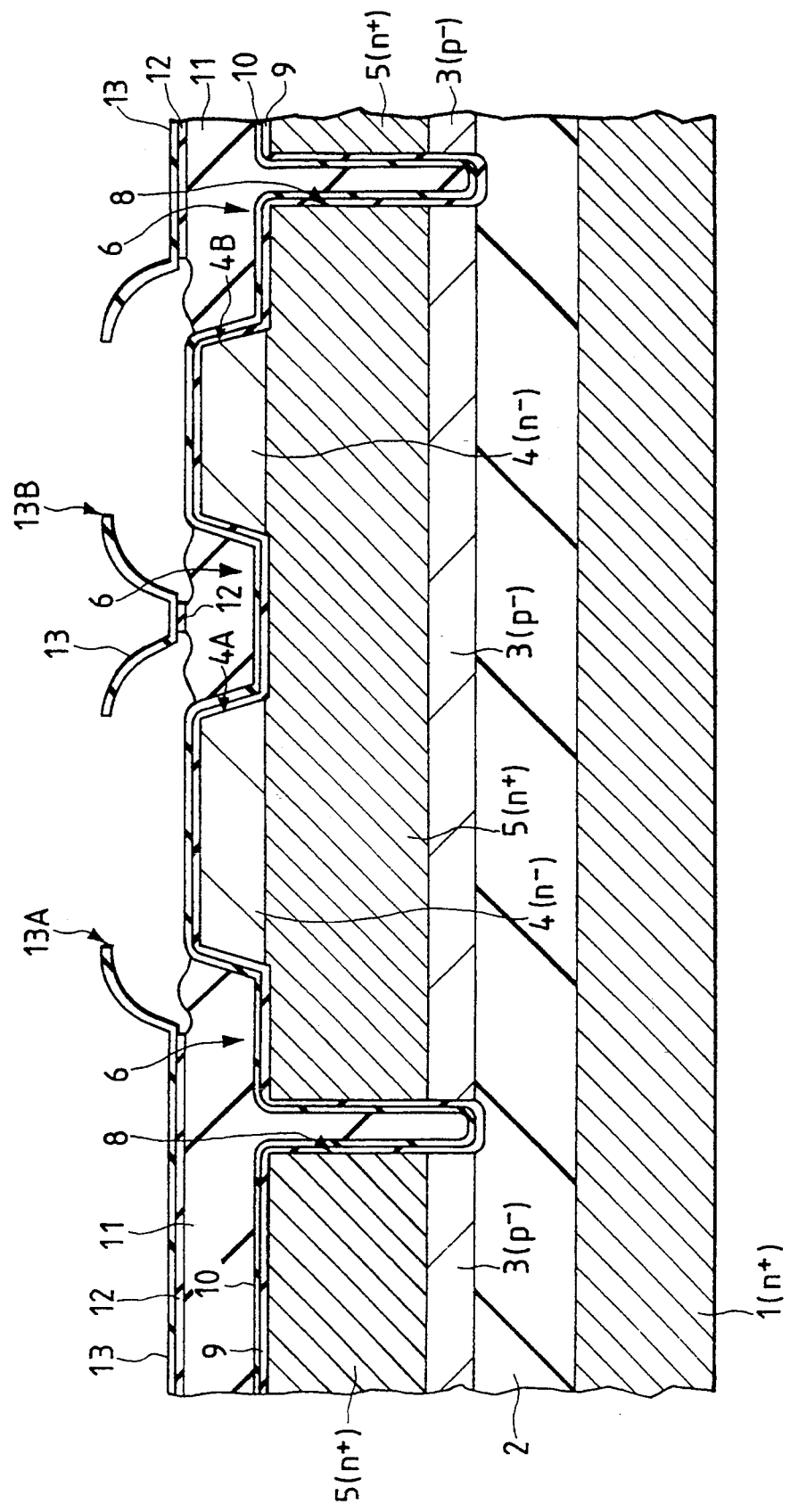
FIG. 8 is a fragmentary cross sectional view of the semiconductor integrated circuit device in a sixth manufacturing step.
Figure 9:
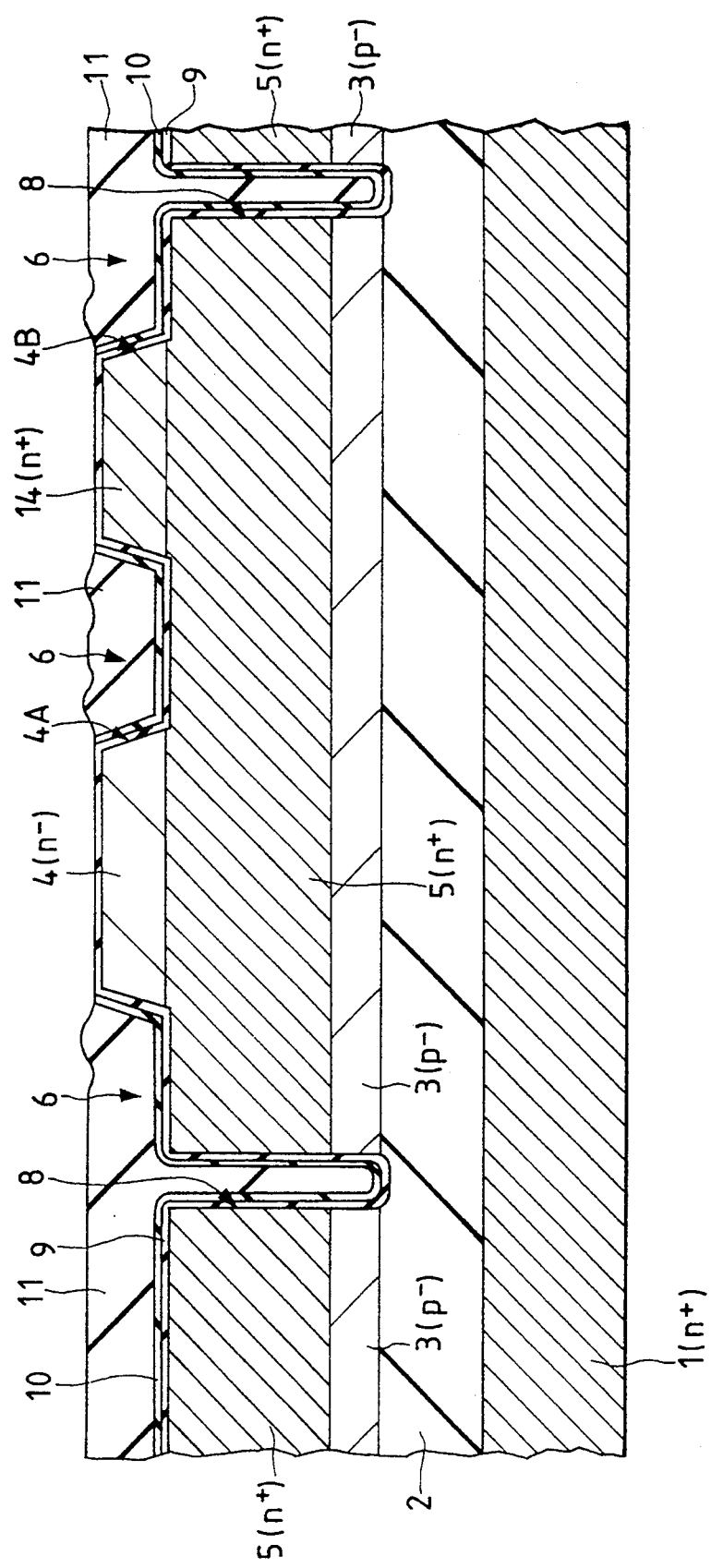
FIG. 9 is a fragmentary cross sectional view of the semiconductor integrated circuit device in a seventh manufacturing step.

Then, using the mask 13 as an etching mask, isotropic etching is applied to each of the mask 12 and the burying material 11 successively under a condition that the etching rate for the mask 12 is greater as compared with that for the burying material 11. For the isotropic etching, a buffer etching solution, for example, at HF:NH₄F=1:5 is used. In the isotropic etching, the mask 12 is at first etched in the direction of the depth within the regions of the opening 13A and the opening 13B of the mask 13, and side etching (lateral etching) to the mask 12 covered with the mask 13 is started. Then, the burying material 11 is etched in the direction of the depth within the region of the opening 13A and the opening 13B of the mask 13, and side etching is started to the burying material 11 covered with the mask 13. Then, an etchant is supplied by way of the region in which the mask 12 was previously removed by side etching, and the burying material 11 covered with the mask 13 is etched in the direction of the depth. That is, the burying material 11 on each of the island region 4A and the island region 4B is etched and the burying material 11 formed to a large thickness in appearance along the step is etched by so much as the film thickness on each of the island region 4A and the island region 4B. With this step, as shown in FIG. 8, the burying material 11a on each of the island region 4A and the island region 4B is removed and, at the same time, the burying material 11b on the shoulder (corner) for each of the island region 4A and the island region 4b is removed.

Then, the mask 13 is removed. In this case, the insulating film 10 on each of the island region 4A and the island region 4B is also removed.

Then, the mask 12 remaining on the burying material 11 is removed. This can attain flattening in this example in which a position for the surface of the insulating film 10 on each of the island region 4A and the island region 4B is substantially aligned with a position for the surface of the burying material 11 on the side of the island region (island region 4A, island region 4B). As a result, an insulating film 15, a gate leading electrode 16 and the like formed by the subsequent steps can be flattened.

Then, an n+-semiconductor region 14 for pulling up the collector potential is formed within the region defined by the island region 4B.

Then, an insulating film 15 is formed on the burying material 11 including an area on the insulating film 10, to form a base opening 17. Subsequently, a base leading electrode 16 is formed on the insulating film 15, and then a p+-semiconductor region 18 as a graft base region and a semiconductor region 23 as an intrinsic base region are formed by self-alignment with the base leading electrode 16.

Then, an interlayer insulating film 19 is formed over the entire surface of the substrate including an area on the base leading electrode 16, to form each of an opening 19a and a collector opening 19c. subsequently, an interlayer insulating film 20 is formed to one end of the base leading electrode 16 on the side of an emitter, and an emitter opening 20 is formed. Then, an emitter leading electrode 22A and, a collector potential pulling up electrode 22B are formed through the emitter opening 21 and the collector opening 19c, respectively. Subsequently, an n+-semiconductor region 24 as the emitter region is formed and an interlayer insulating film 25 is formed over the entire surface of the substrate.

Then, each of connection holes 25a, 25b and 25c is formed to the internal insulating film 25. Subsequently, an emitter electrode 29A is connected with the emitter leading electrode 22A, a base electrode 29B is connected with the base leading electrode 16 and a collector electrode 29C is connected with the collector potential pulling up electrode 22B, respectively, through each of the connection holes 25a, 25b and 25c, thereby substantially completing the semiconductor integrated circuit device having the bipolar transistor of the vertical structure in this example.

As apparent from the foregoing descriptions, according to this embodiment, the following advantageous effects can be obtained.

In the method of manufacturing a semiconductor integrated circuit device by forming the groove 6 to the main surface in the non-active region of the SOI substrate, forming each of the island region 4A and the island region 4B defined at the periphery thereof with the groove 6 to the main surface of the active region of the SOI substrate and insulating and isolating each of the island region 4A and the island region 4B with the burying material 11 buried in the groove 6, flattening can be attained such that the position for the upper surface of each of the island region 4A and the island region 4B is substantially aligned with the position for the surface of the burying material 11 on the side of the island region.

EXAMPLE 2

This Example 2 is a second embodiment of the present invention in which the invention is applied to a semiconductor integrated circuit device having a bipolar transistor of a vertical structure.

Figure 10:
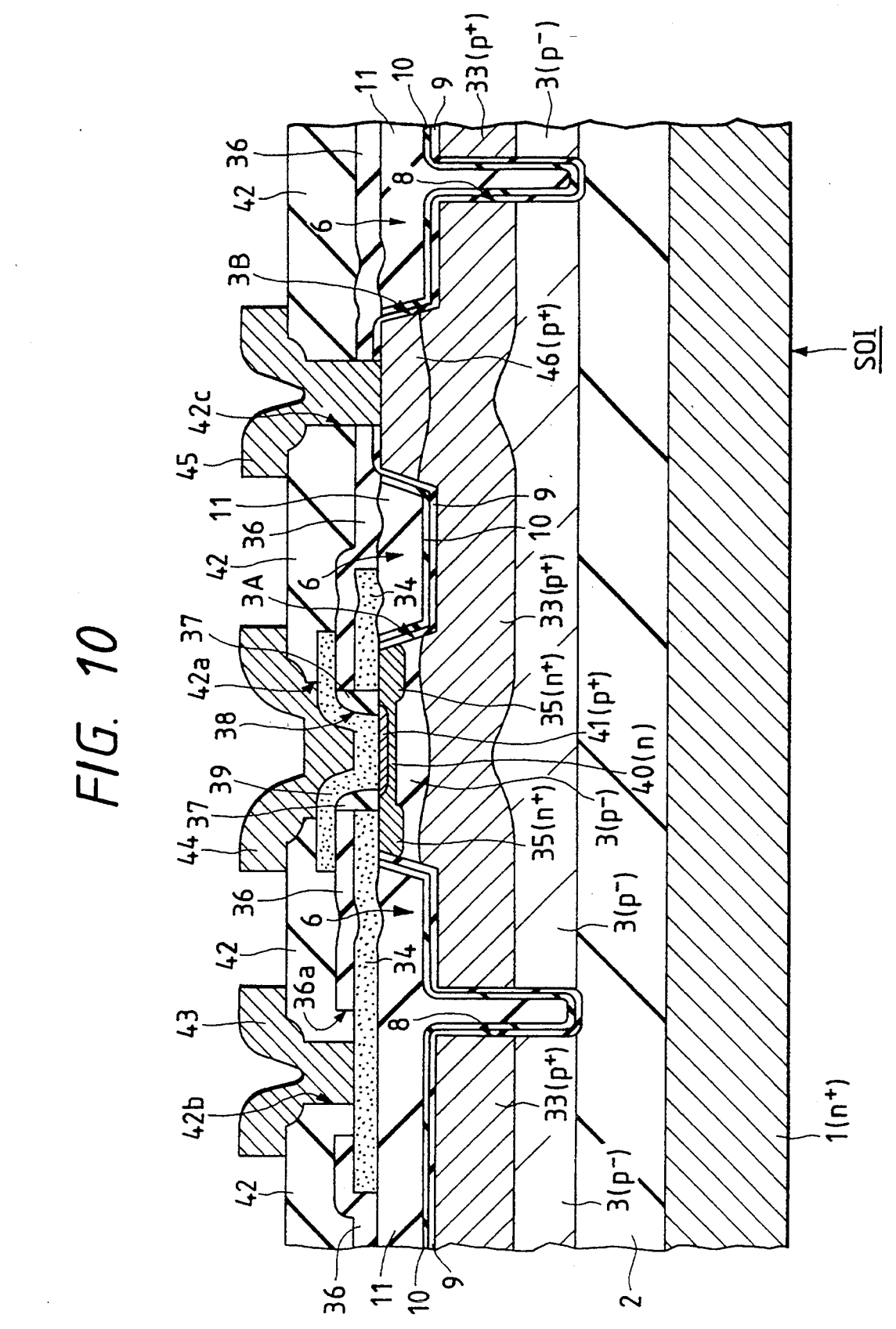

A schematic constitution of a semiconductor integrated circuit device having a bipolar transistor of a vertical structure as Example 2 of the present invention will be shown in FIG. 10 (fragmentary plan view).

As shown in FIG. 10, the semiconductor integrated circuit device having the bipolar transistor of the vertical structure mainly comprises an SOI substrate of an SOI structure. The SOI substrate in this example is constituted by laminating a p−-semiconductor substrate 3, for example, made of single crystal silicon to a main surface of a base substrate 1 by way of an insulating film 2. The base substrate 1 is formed, for example, with an n+-semiconductor substrate, such as, made of single crystal silicon like that an Example 1 described above. The insulating film 2 is formed, for example, with a thermally oxidized silicon film.

Each of an island region 3A and an island region 3B is formed to the main surface of an active region in the SOI substrate. Each of the island region 3A and the island region 3B is constituted by forming a groove 6 extending from the surface of the p−-semiconductor substrate 3 in the direction of the depth thereof, in a non-active region of the p−-semiconductor substrate 3. An insulating film 9, an insulating film 10 and a burying material 11 are successively buried in the groove 6. That is, each of the island region 3A and the island region 3B is defined at the periphery thereof by the groove 6 and electrically isolated from other active regions, for example, by the burying material 11.

A bipolar transistor of a vertical structure is formed to the main surface in the active region of the SOI substrate. The bipolar transistor of the vertical structure is constituted as a pnp type, in which a p-emitter region, n-base region and p-collector region are arranged successively from the surface of the p−-semiconductor substrate 3 in the direction of the depth thereof, respectively.

The p-collector region is constituted with an intrinsic collector region, a graft collector region and a collector potential pulling up p+-semiconductor region 46. The intrinsic collector region is formed to the island region 3A. That is, the intrinsic collector region is constituted with a p−-semiconductor region 3 comprising the p−-semiconductor substrate 3. The graft collector region is constituted with a burying type p+-semiconductor region 33. The buried type p+-semiconductor region 33 is surrounded at the periphery thereof by a trench groove 8 extending from the bottom of the groove 6 in the direction of the depth thereof as far as the insulating film 2, and it is electrically isolated from other active regions. The collector potential pulling up p+-semiconductor region 46 is formed to the island region 3B. The p+-semiconductor region 46 is in contact and electrically connected with the burying type p+-semiconductor region 33.

The collector potential pulling up p+-semiconductor region 46 as the collector region is connected with a collector electrode 45 through a connection hole 42c formed in an interlayer insulating film 36 and an interlayer insulation film 42. The collector electrode 45 is formed, for example, with an aluminum film deposited by a sputtering process.

The n-base region is constituted with an intrinsic base region and a graft base region. The intrinsic base region is constituted with an n-semiconductor region 40, The n-semiconductor region 40 is formed to the surface of the p⁻-semiconductor region 3 within a region defined by the island region 3A. The graft base region is constituted with the n+-semiconductor region 35. The n+-semiconductor region 35 is formed to the main surface of the p⁻-semiconductor region 3 within the region defined by the island region 3A, and a portion thereof is in contact and electrically connected with the p⁻-semiconductor region 3 as the intrinsic base region.

The n+-semiconductor region 35 as the graft base region is connected with one end of the base leading electrode 34 on the side of the emitter. The base leading electrode 34 is formed, for example, with a polycrystalline silicon film introduced with an n-impurity for reducing the resistance value. The other end of the base leading electrode 34 is connected with a base electrode 43 through a connection hole 42b formed in the interlayer insulating film 42. The base electrode 43 is formed in the same manufacturing step as that for the collector electrode 45. An opening 36a is formed in the interlayer insulating film 36 below the base electrode 43.

Each of the n-semiconductor region 40 as the intrinsic base region and the n+-semiconductor region 35 as the graft base region is formed by self-alignment with the base leading electrode 34.

The emitter region is constituted with a p+-semiconductor region 41. The p+-semiconductor region 41 is constituted to the main surface of the n-semiconductor region 40 as the intrinsic base region. The p+-semiconductor region 41 as the emitter region is connected with an emitter leading electrode 39 through an emitter opening 38. The emitter leading electrode 39 is formed, for example, with a polycrystalline silicon film introduced with a p-impurity for reducing the resistance value. The emitter opening 38 is formed within a region defined by the interlayer insulating film (side wall spacer) 37 formed at one end of the base leading electrode 34 on the side of the emitter and is formed by self alignment with the base leading electrode 34.

The emitter leading electrode 39 is connected with an emitter electrode 44 through a connection hole 42b formed in an interlayer insulating film 42. The emitter electrode 44 is formed by the same manufacturing step as that for the collector electrode 45.

The burying material 11 is formed by the same manufacturing method as that for Example 1 described above. That is, the position for the surface of the burying material 11 on the side of each of the island region 3A and the island region 3B is substantially aligned with the position for the upper surface of each of the island region 3A and the island region 4B, thereby attaining flattening.

The burying type p+-semiconductor region 33 as the graft collector region is formed, after the step of forming the groove 6, by introducing a p-impurity to the main surface of the p⁻-semiconductor substrate 3 at the bottom of the groove 6, applying a heat diffusion treatment and joining them below each of the island region 4A and the island region 4B. In the existent pnp (or npn) type bipolar transistor of the vertical structure, the burying type semiconductor region for pulling up the collector potential to the surface is formed by introducing an impurity to the substrate and growing an epitaxial layer on the surface of the substrate. That is, the burying type n+-semiconductor region 33 in this example can be formed from the surface for each of the island region 3A and the island region 3B to a position isolated by the depth of the groove 6. As a result, it is possible to save the epitaxial layer and decrease the number of manufacturing steps for the semiconductor integrated circuit device by so much as the forming step.

Description will now be made briefly to a method of manufacturing a burying type P+-semiconductor region 33 as the graft collector region with reference to FIG. 11 through FIG. 13.

At first, in a bipolar transistor forming region of an SOI substrate, a mask 30 is formed on the main surface of an active region of the p⁻-semiconductor substrate 3. The mask 30 is formed, for example, with a photoresist film.

Then, using the mask 30 as an etching mask, anisotropic etching is applied to the surface of a non-active region of the p⁻-semiconductor substrate 3, to form groove 6 each extending from the surface of the p⁻-semiconductor substrate 3 in the direction of the depth thereof, and form each of the island region 3A and the island region 3B each defined at the periphery thereof with the grooves 6.

Figure 11:
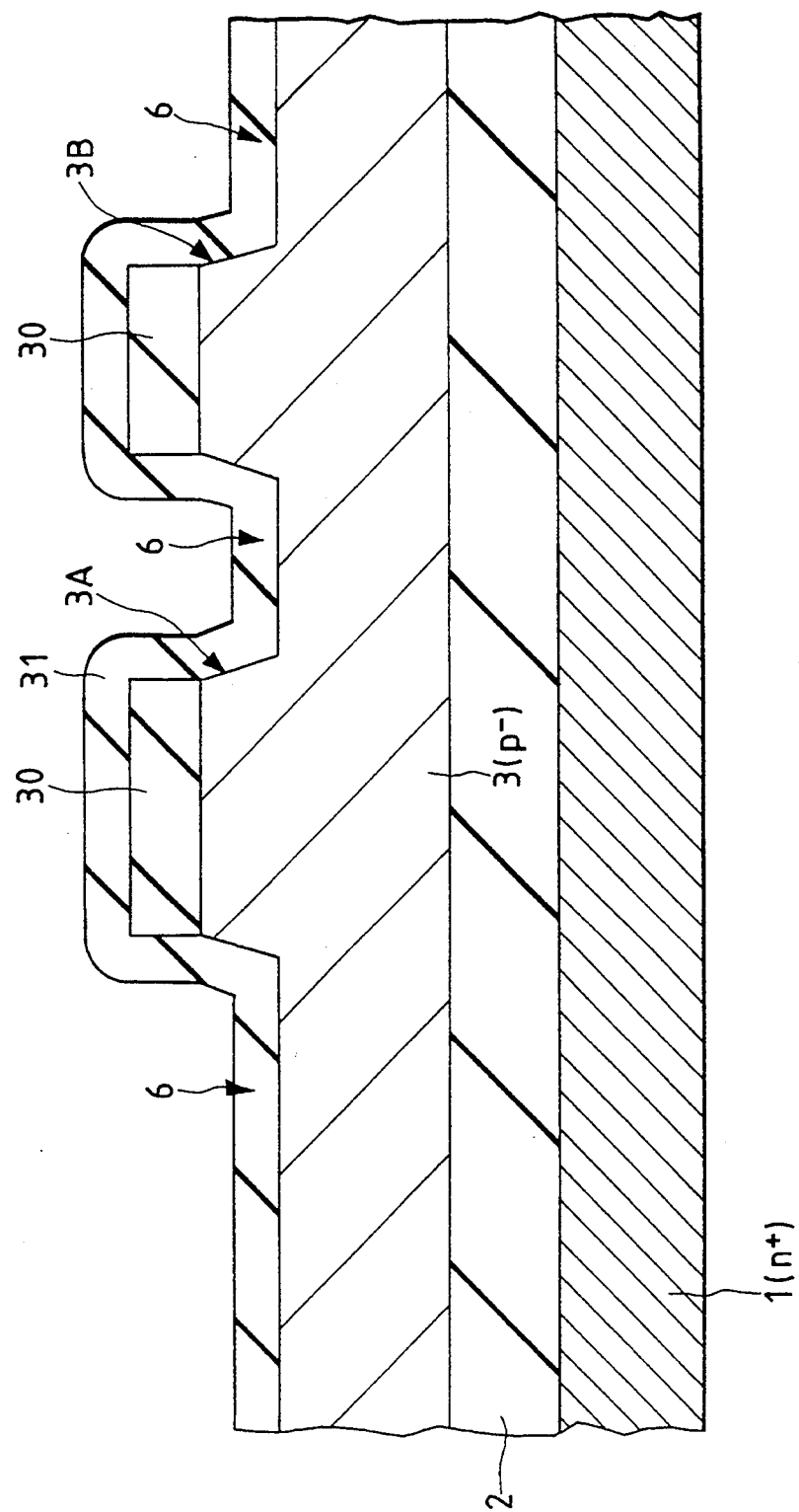
FIG. 11 is a fragmentary cross sectional view of the semiconductor integrated circuit device in a first manufacturing step.

As shown in FIG. 11, an insulating film 31 is formed over the entire surface of the substrate including areas on the grooves 6 and the mask 30. The insulating film 31 is formed, for example, with a silicon oxide film deposited by a CVD process.

Then, anisotropic etching is applied to the insulating film 31, to form a side wall spacer 31A on the side walls for each of the mask 30, the island region 3A and the island region 3B. The side wall spacer 31A is formed by self-alignment with the island region 3A and the island region 3B.

Then, using the mask 30 and the side wall spacer 31A as a mask for introducing an impurity, p-impurity is introduced by ion implantation to the bottom of the groove 6 on the main surface of the p⁻-semiconductor substrate 3, at a concentration higher than that of the impurity in the p⁻-semiconductor substrate 3, to form a p+-semiconductor region 32. As the p-impurity, boron is used for instance. Further, it is also possible to restrict the ion implantation region by using the mask 30 and the side wall spacer 31A together with a photoresist mask as required.

Then, a mask 7 having an opening in a trench isolating region is formed in the same manner as in Example 1 described above. Subsequently, using the mask 7 as an etching mask, trench grooves 8 each extending from the surface of the groove 6 in the direction of the depth thereof and reaching the insulating film 2 is formed as shown in FIG. 13.

Then, a heat diffusion treatment is applied and the p+-semiconductor region 32 is extended and joined below the region for each of the island region 3A and the island region 3B, thereby forming the burying type p+-semiconductor region 33 as shown in FIG. 10. The burying type p+-semiconductor region 33 is restricted depending on the depth of the grooves 6 and formed from the surface for each of the island region 3A and the island region 3B to a position corresponding to the depth of the groove 6.

Subsequently, the burying material 11 is buried into the groove 6 by the same manufacturing method as that for Example 1 described above.

As apparent from the foregoing descriptions, the following advantageous effects can be obtained in this example.

In the method of manufacturing the semiconductor integrated circuit device, flattening can be attained in the same manner as in Example 1 described above, such that the position on the upper surface for each of the island region 3A and the island region 3B is substantially aligned with the position for the surface of the burying material 11 on the side of the island region.

Further, in the method of manufacturing the semiconductor integrated circuit device, since the n+-semiconductor region 33 at a high concentration can be formed from the upper surface for each of the island region 3A and the island region 3B to a position isolated by the depth of the groove 6, the burying type n+-semiconductor region 33 can be formed without forming the epitaxial layer. As a result, since the step for forming the epitaxial layer can be saved, the number of steps for the semiconductor integrated circuit device can be reduced by so much as the manufacturing step.

EXAMPLE 3

This Example 3 is a third example of the present invention in which the invention is applied to a semiconductor integrated circuit device having MISFET.

Figure 14:
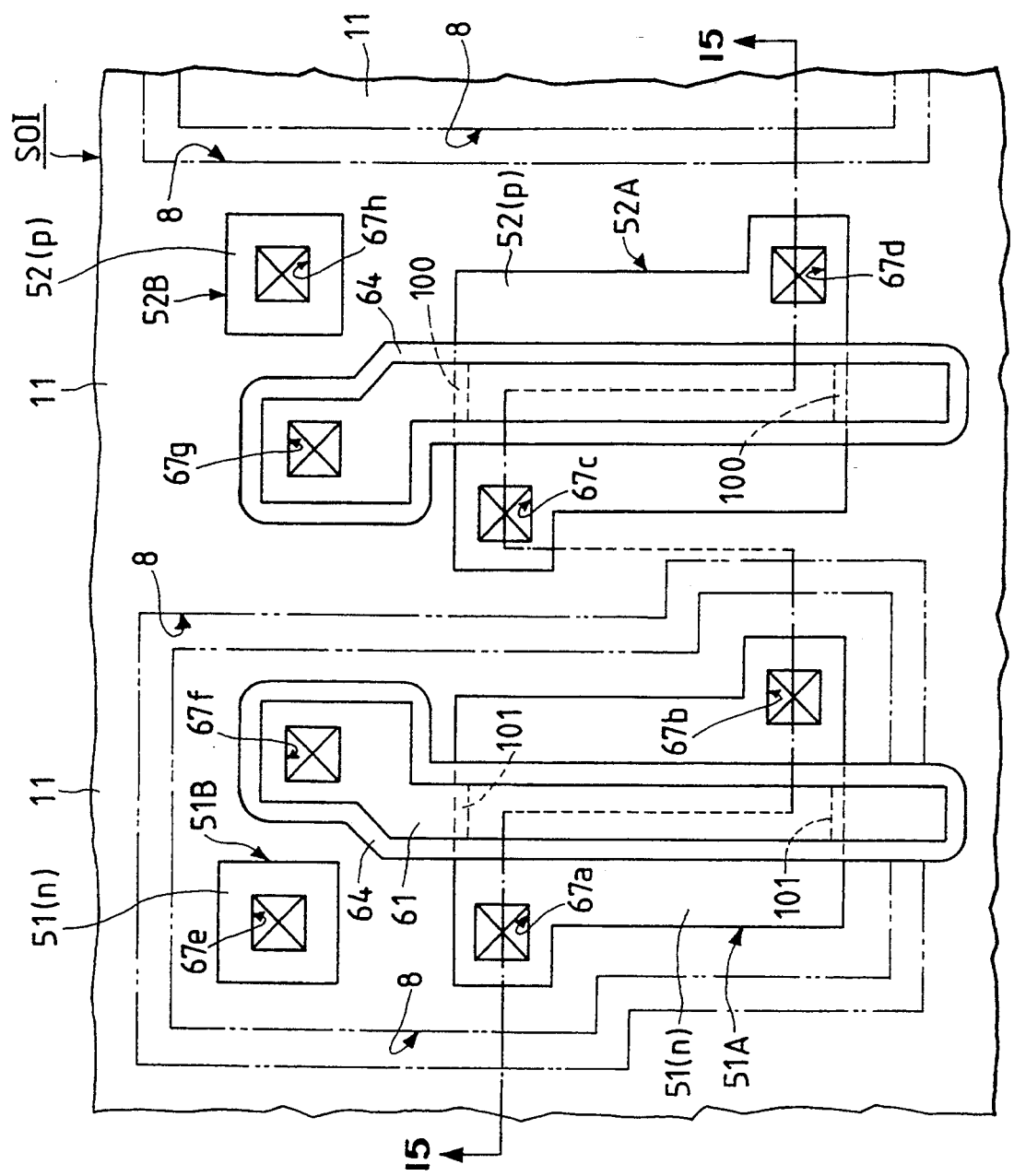
FIG. 14 is a fragmentary plan view of a semiconductor integrated circuit device having MISFET as Example 3 according to the present invention.
Figure 15:
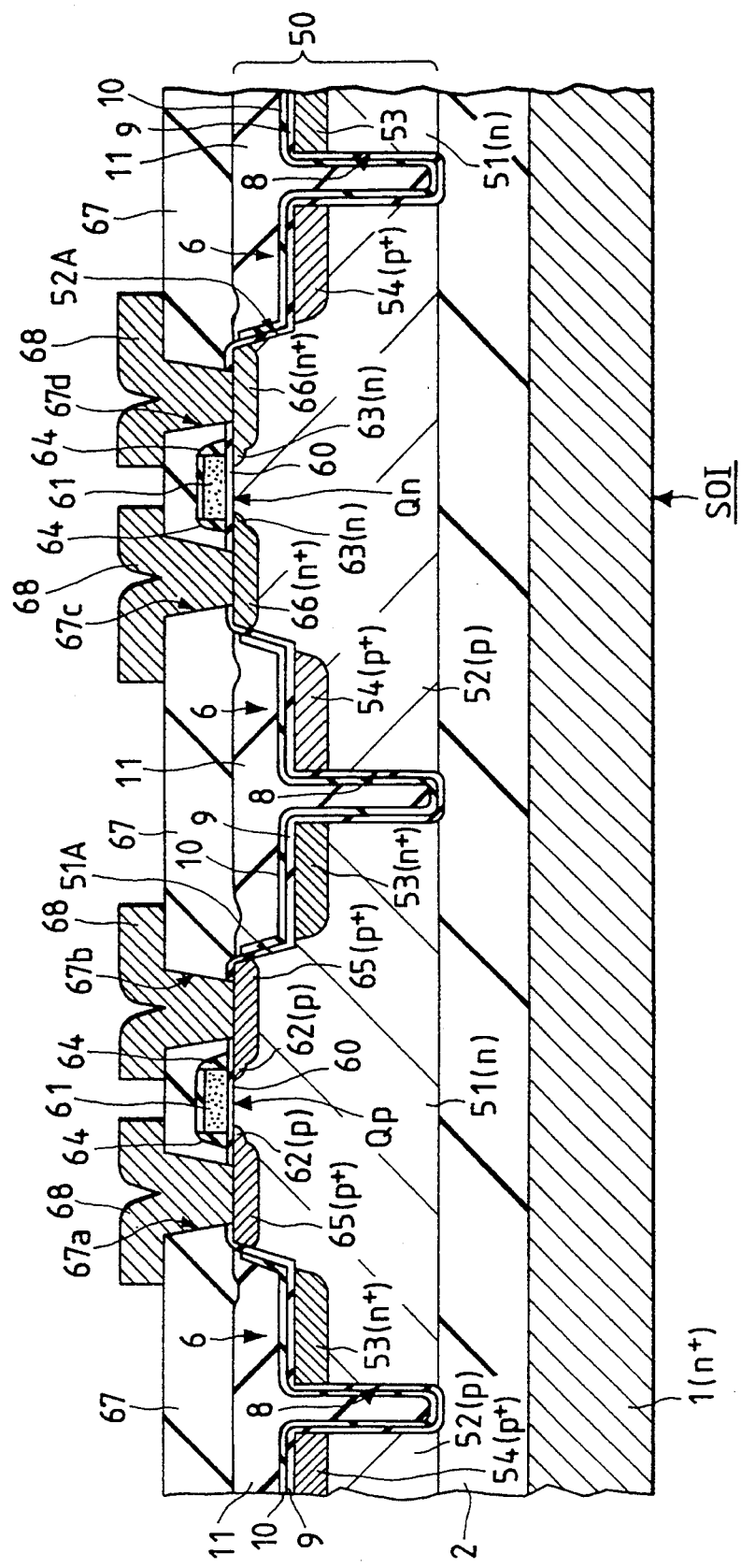
FIG. 15 is a fragmentary cross sectional view taken along line B—B in FIG. 14.

A schematic constitution of a semiconductor integrated circuit device having MISFET as Example 3 according to the present invention is illustrated in FIG. 14 (fragmentary plan view) and FIG. 15 (fragmentary cross sectional view taken along line B—B in FIG. 14).

As shown in FIGS. 14 and 15, the semiconductor integrated circuit device having MISFET is constituted mainly with an SOI substrate comprising an SOI structure. The SOI substrate has such a constitution that a semiconductor substrate 50 made, for example, of single crystal silicon is deposited by way of an insulating film 2 on a main surface of a base substrate 1. An island region 51A, an island region 51B, an island region 52A and an island region 52B are formed, respectively, to the main surface of the SOI substrate. Each of the island regions 51A, 51B, 52A, 52B is formed by forming a groove 6 extending from the surface of the semiconductor substrate 50 in the direction of the depth thereof. An insulating film 9, an insulating film 10 and a burying material 11 are successively buried in the groove 6. In the same manner, each of the films is buried also in a trench groove 8. That is, each of the island regions 51A, 51B, 52A and 52B is defined at the periphery thereof by the groove 6, and electrically isolated from other active regions by the burying material 11 or the like. Each of the island region 51A and the island region 51B is formed to a n-well region 51 formed to a main surface of an active region of the semiconductor substrate 50. Each of the island region 52A and the island region 52B is formed to a main surface of a p-well region 52 formed to a main surface of an active region of the semiconductor substrate 50.

A p-channel MISFETQp is formed on the main surface of the n-well region in the region of the island region 51A. The p-channel MISFETQp comprises an n-well region (channel forming region) 51, a gate insulating film 60, a gate electrode 61, a pair of p+-semiconductor regions 65 and a pair of p-type semiconductor regions 62 as a source region and the drain region. The p-semiconductor region 62 is formed to a concentration lower than that of the impurity in the p+-semiconductor region 65. The p-semiconductor 62 is formed by self-alignment with the gate electrode 61. The p+-semiconductor region 65 is formed by self-alignment with the interlayer insulating film (side wall spacer) 64 formed on the side wall of the gate electrode 61. That is, the p-channel MISFET Qp is constituted as an LDD structure.

An n-channel MISFET Qn is constituted to the main surface of the p-well region in the region of the island region 52A. The n-channel MISFET Qn comprises a p-well region (channel well region) 52, a gate insulating film 60, a gate electrode 61, a pair of n+-semiconductor regions 66 and a pair of n-semiconductor regions 63 as a source region and the drain region. The n-semiconductor region 63 is formed at a concentration lower than that of the impurity in the n+-semiconductor region 66. The n-semiconductor region 63 is formed by self-alignment with the gate electrode 61. The n+-semiconductor region 66 is formed by self-alignment with the interlayer insulating film 64 formed on the side wall of the gate electrode 61. That is, the n-channel MISFET Qn is constituted as the LDD structure.

In the n-channel MISFET Qn, a wiring 68 is connected to each of one of the n+-semiconductor regions 66 and the other of the n+-semiconductor regions 66, through each of a connection hole 67c and a connection hole 67d formed in an interlayer insulating film 67. A wiring 68 is connected to each of one of the p+-semiconductor regions 65 and the other of the p+-semiconductor regions 65, through each of a connection hole 67a and a connection hole 67b formed in an interlayer insulating film 67. The wiring 68 is formed for example, with a tungsten film.

The burying material 11 is formed by the same manufacturing method as in Example 2 described previously. That is, in the semiconductor integrated circuit device of this example, flattening is attained such that the position for the upper surface of each of the island regions 51A, 51B, 52A, 52B is substantially aligned with the position for the surface of the burying material 11 on the side of the island region.

A wiring is connected to the gate electrode 61 of the n-channel MISFET Qn through a connection hole 67g formed in the interlayer insulating film 67. The gate electrode 61 is led out at both ends thereof by way of the gate insulating film 60 from the area on the island region 51A to the area on the burying material 11. Since flattening is attained such that the position for the surface of the burying material 11 on the side of the island region and the position for the upper surface of the island region 51A are substantially aligned, localization of field effects from two positions caused by a step formed at the ends in the direction of the gate width of the island region 51A does not occur, and fluctuation of a threshold voltage of the n-channel MISFET Qn can be reduced. The gate electrode 61 of the p-channel MISFETQp is connected with a wiring through a connection hole 67f formed in the interlayer insulating film 67. The gate electrode 61 is led out at both ends thereof by way of the gate insulating film 60 from the area on the island region 52A to the area on the burying material 11, and fluctuation of the threshold voltage of the p-channel MISFETQp can be reduced in the same manner as in the n-channel MISFET Qn described above.

In the n-well region 51, the island region 51B is constituted for the supply of a well potential. The island region 51B is connected with a wiring through a connection hole 67e formed in the interlayer insulating film 67. In the p-well region 52, the island region 52B is constituted for the supply of a well potential. The island region 52B is connected with a wiring through a connection hole 67h formed in the interlayer insulating film 67.

An n+-semiconductor region 53 is formed to the bottom of the groove 6 on the main surface of the n-well region 51. The n+-semiconductor region 53 is set to a high concentration as compared with the concentration of the impurity in the n-well region 51. That is, the semiconductor region 53 reduces the well resistance (substrate resistance) of the n-well region 51. In the same way, a p+-semiconductor region 54 is formed to the bottom of the groove 6 on the main surface of the p-well region 52. The p+-semiconductor region 54 is set at a concentration higher than that of the impurity in the p-well region 52. That is, the p+-semiconductor region 54 reduces the well resistance of the p-well region 52.

Figure 12:
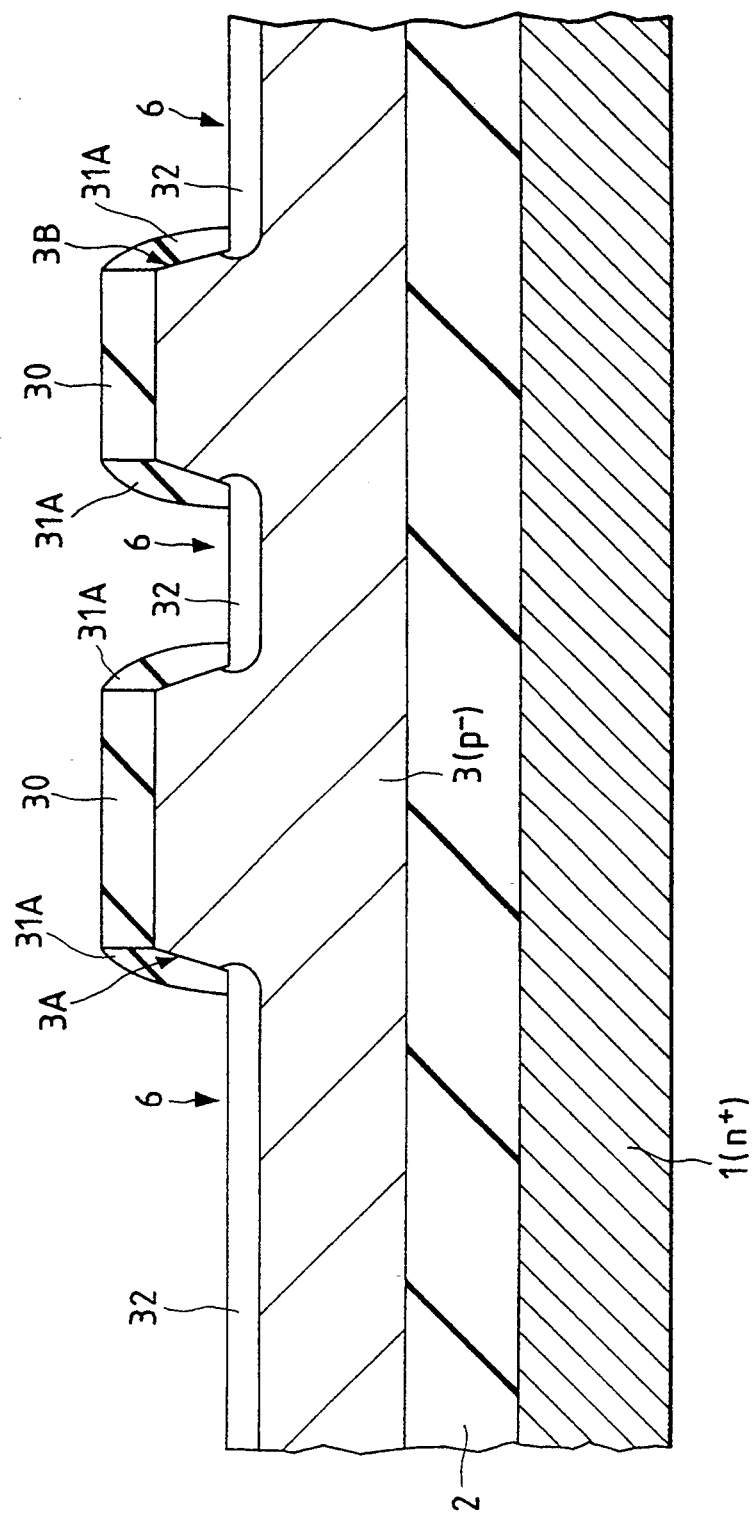
FIG. 12 is a fragmentary cross sectional view of the semiconductor integrated circuit device in a second manufacturing step.
Figure 13:
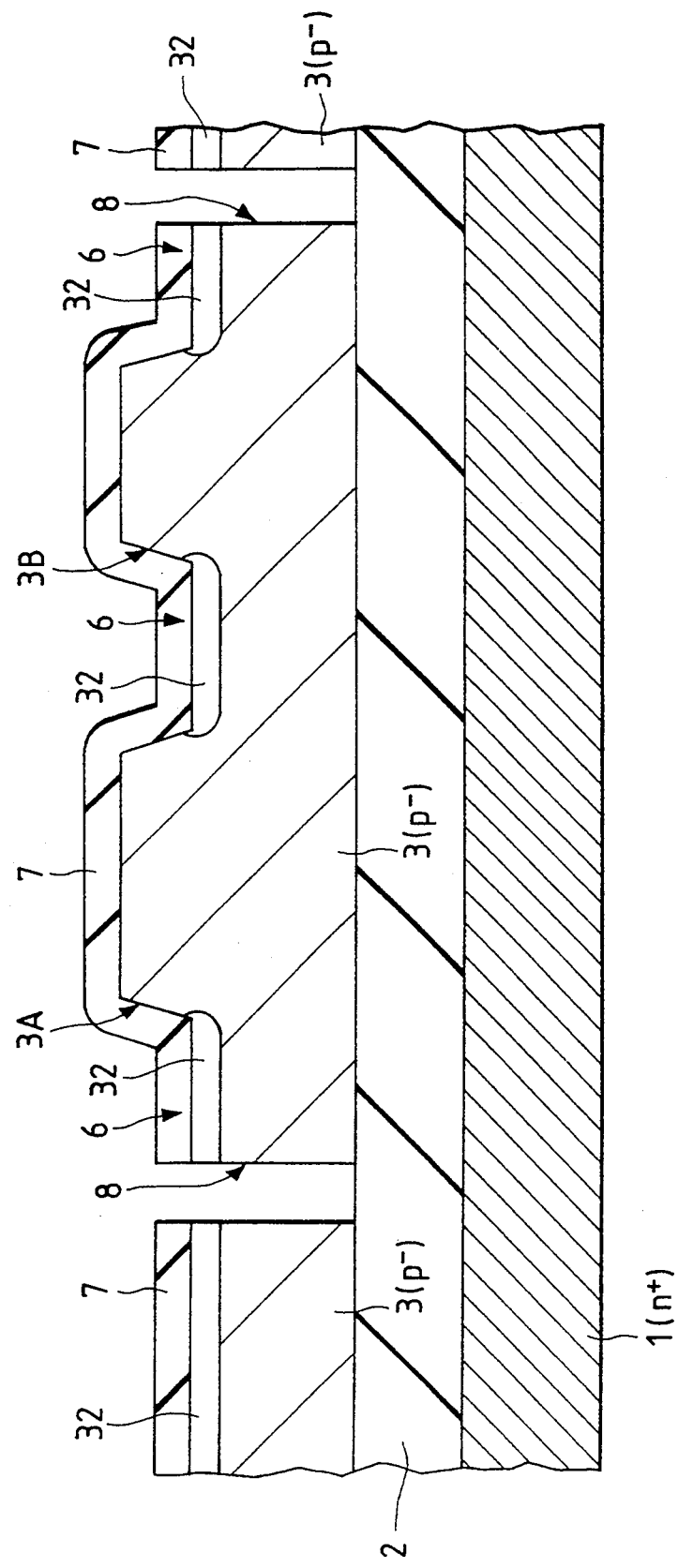
FIG. 13 is a fragmentary cross sectional view of the semiconductor integrated circuit device in a third manufacturing step.

Each of the n+-semiconductor region 53 and the p+-semiconductor region 54 is formed by using the mask 30 and the side wall spacer 31A in FIG. 12 for Example 2 as an impurity introduction mask and introducing each of the n-impurity and the p-impurity respectively to the bottom of the groove 6 by ion implantation.

As apparent from the foregoing description, the following advantageous effects can be obtained according to the this example.

In the semiconductor integrated circuit device, flattening can be attained like that in the Example 1 described previously, in which the position for the upper surface of each of the island regions 51A, 51B, 52A, 52B is substantially aligned with the position for the surface of the burying material 11 on the side of the island region.

Further, in the semiconductor integrated circuit device, fluctuation of a threshold voltage for each of the n-channel MISFET Qn and the p-channel MISFETQp can be reduced.

Further, in the semiconductor integrated circuit device, the well resistance (substrate resistance) for each of the n-well region 51 and the p-well region 52 can be reduced.

EXAMPLE 4

This Example 4 is a fourth example according to the present invention, in which the invention is applied to a semiconductor integrated circuit device having MISFET.

In Example 4 according to the present invention, as shown in FIG. 14, a p+-semiconductor region 100 set at a concentration higher than that of the impurity in a p-well region 52 is formed to the end in the direction of the gate width of the island region 52A below the gate electrode 61 in an n-channel MISFET Qn.

In the method of forming the p+-semiconductor region 100, as shown in FIG. 16, a burying material 11 is at first buried in a groove 6 by the same forming method as that in Example 1 and then the surface of the burying material 11 is etched to lower, in the direction of the depth, as compared with the position for the upper surface of the island region 52A.

Then, a thermal oxidizing treatment is applied to form an insulating film 99 formed with a silicon oxide film on the surface of the island region 52A. The insulating film 11 is formed at a substantially uniform film thickness for each of the lateral sides and the upper surface of the island region 52A.

Subsequently, a p-impurity is introduced, by iron implantation, to a main surface of the p-well region, at a shoulder (end) at which the lateral side and the upper surface of the island region 52A intersects to form a p+-semiconductor region 100 set to a high concentration as compared with the impurity concentration in the p-well region. Upon introduction of the p-impurity, it is introduced at an angle inclined to the upper surface of the island region 52A. That is, the incident angle of the ion beam upon ion implantation is set such that the angle formed between the upper surface of the island region 52A and the ion beam is smaller than the angle formed between the lateral side of the island region 52A and the ion beam. For instance, if the angle made between the lateral side and the upper surface of the island region 52A is 90°. Ion implantation can be conducted at an incident angle of less than 45°. Referring to the p type impurity introduced under this condition, since the apparent film thickness is increased in the insulating film 99 on the upper surface of the island region 52A, the amount of the p-impurity introduced through the insulating film 99 on the lateral side of the island region 52A is increased as compared with the amount of the p-impurity introduced through the insulating film 99 on the upper surface of the island region 52A. That is, the p+-semiconductor region 100 is formed along the end that defines the gate width of the island region 52A.

Then, a n-channel MISFET Qn is formed at the upper surface of the island region 52A in the main surface of the p-well region 52. In the step of forming the n-channel MISFET Qn, since the n-impurity is introduced by ion implantation using the gate electrode 61 as a mask upon forming a pair of n-semiconductor region 63 and n+-semiconductor regions 66 as the source region and the drain region, the p+-semiconductor region 100 other than that below the gate electrode 61 is offset with the n-impurity and, as a result, the p+-semiconductor region 100 is formed below the gate electrode 61. As a result, since the p+-semiconductor region 100 set to a higher impurity concentration as compared with that in the channel forming region can be formed at the end below the gate electrode 61 for defining the gate width of the island region 52A, the threshold voltage at the end of the lateral direction of the gate of the island region 52A can be increased. As a result, it is possible to reduce the fluctuation of the threshold voltage for the n-channel MISFET Qn due to the localization of the field effect caused by the step.

Although descriptions have been made in this example to the n-channel MISFET Qn, a similar effect can also be obtained for the p-channel MISFET Qp.

In the case of the p-channel MISFET Qp, a p+-semiconductor region 101 is formed below the gate electrode 61 as shown in FIG. 14.

Further, although the step is formed by burying the burying material 11 and then etching the burying material 11 in the present invention, the step formed by the existent BOX technology can be utilized for instance.

Further, as shown in FIG. 17, an insulating film (side wall spacer) 102 may be formed at the end of the island region 52A at which the step is formed.

EXAMPLE 5

This Example 5 is a fifth example according to the present invention in which the invention is applied to a semiconductor integrated circuit device having DRAM (Dynamic Random Access Memory).

Figure 18:
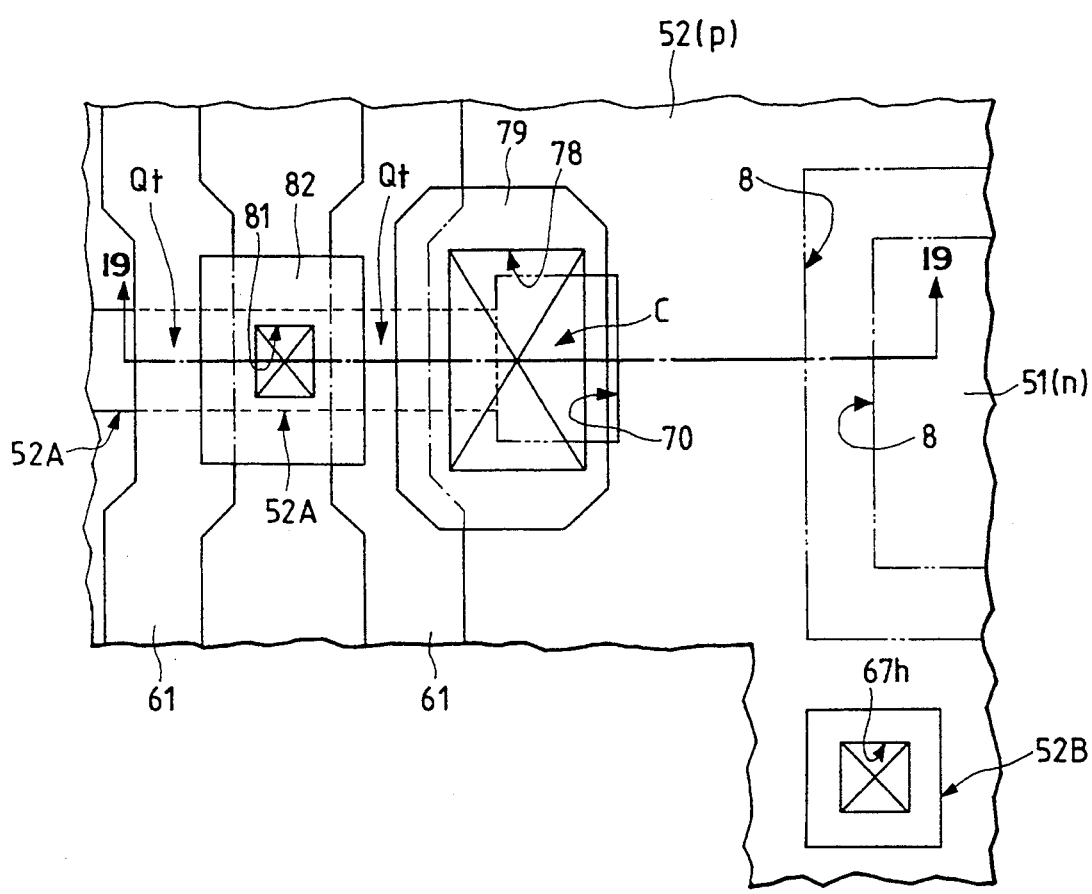
FIG. 18 is a fragmentary plan view of a semiconductor integrated circuit device having DRAM as Example 5 according to the present invention.
Figure 19:
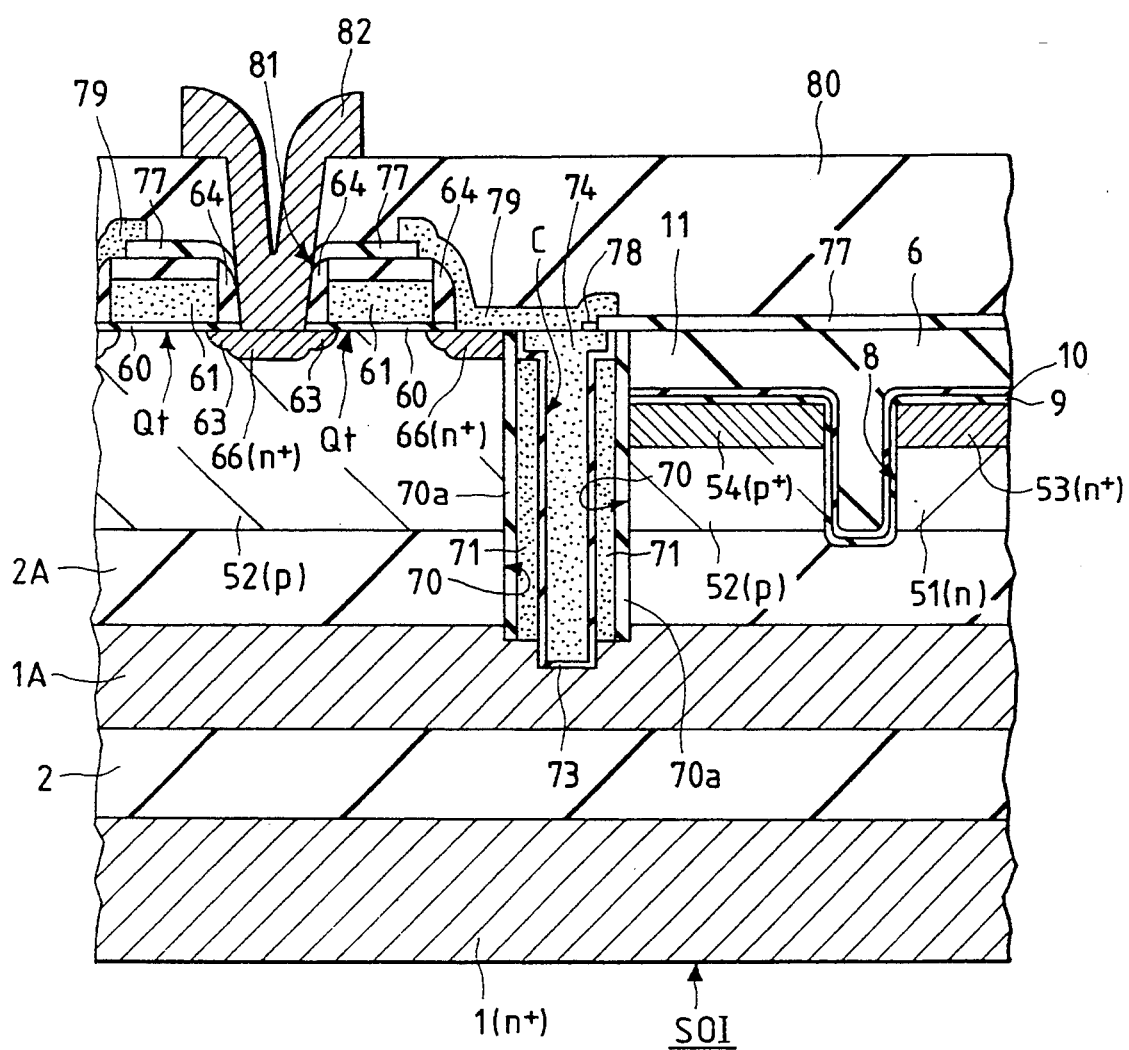
FIG. 19 is a fragmentary cross sectional view taken along line C—C in FIG. 17.

A schematic constitution of a semiconductor integrated circuit device having DRAM as Example 5 according to the present invention is shown in FIG. 18 (fragmentary plan view) and FIG. 19 (fragmentary cross sectional view taken along line C—C in FIG. 18).

As shown in FIGS. 18 and FIG. 19, the semiconductor integrated circuit device having DRAM mainly comprises an SOI substrate of a SOI structure. The SOI substrate has a constitution in which an n+-semiconductor layer 1A is formed, for example, by way of a insulating film 2 on a main surface of a base substrate 1, and a semiconductor layer is formed by way of an insulating film 2A on a main surface of the n+-semiconductor layer 1A.

A memory cell of DRAM is constituted on a main surface of an active region of the SOI substrate. The memory cell comprises a serial circuit of a memory cell selecting MISFET Qt and an information accumulating capacitance element C.

The memory cell selecting MISFET Qt is constituted on a main surface of an island region 52A formed on a main surface of a P-well region 52. That is, the memory cell selecting MISFET Qt comprises a gate insulating film 60, a gate electrode 61 formed integrally with a word line 61 (WL), an n-semiconductor region 63 formed by self-alignment with the gate electrode 61 and an n+-semiconductor region 66 formed by self-alignment with a side wall spacer 64. Each of the n-semiconductor region 63 and the n+-semiconductor region 66 has a function of the source region or the drain region of the memory cell selecting MISFET Qt. The n+-semiconductor region 66 is connected with a wiring 82 through an opening 81 defined with an interlayer insulating film 77.

The information accumulating capacitance element C is constituted in a small aperture 70 extending from the surface of the p-well region 52 in the direction of the depth thereof and reaching the n+-semiconductor layer 1A. The information accumulating capacitance element C comprises a plate electrode 71, a node electrode 74 and an dielectric film 73, formed by way of an insulating film 70a formed on the side wall of the small aperture 70. The plate electrode 71 is connected with the n+-semiconductor layer 1A. The node electrode 74 is connected through an opening 77 with a leading electrode 79. The leading electrode 79 is connected with the n+-semiconductor region 66. That is, the node electrode 74 of the information accumulating capacitance element C is connected by way of a leading electrode 79 to the n+-semiconductor region 66 of the memory cell selecting MISFET Qt. The plate electrode 71 is applied with a voltage, for example, at ½ (Vcc).

The island region 52A is defined at the periphery thereof with a groove 6 and electrically isolated from other active regions. In the same manner as in Example 3 described previously, an insulating film 9, an insulating film 10 and a burying material 11 are successively buried in the groove 6. Further, in the same manner, the insulating film 9, the insulating film 10 and the burying material 11 are successively buried also in a trench groove 8. The trench groove 8 isolates the p-well region 52 and the n-well region 51 from each other. That is, the semiconductor integrated circuit device in this example, is constituted in such a flattened state that the surface at the end of the burying material 11 on the side of the island region is substantially aligned with the upper surface for each of the island region 52A and the island region 52B. The island region 52B is used for supplying the well potential and connected with a wiring through a connection hole 67h. The p+-semiconductor region 54 reduces the well resistance of the p-well region 52. Further, the n+-semiconductor region 53 reduces the well resistance of the n-well region 51.

The semiconductor integrated circuit device having DRAM constituted as described above can provide the same advantageous effects as those in Example 3 described previously.

Descriptions have been made concretely for the invention made by the present inventors with reference to the preferred embodiments, but the present invention is not restricted only to the embodiments described above but it will be apparent that various modifications are possible within the scope not departing the gist thereof.

For instance, the present invention is also applicable to a semiconductor integrated circuit device having a bipolar transistor and MISFET.

What is claimed is:

1. A method of manufacturing a semiconductor integrated circuit device of forming grooves to a main surface of a non-active region of a semiconductor substrate or semiconductor layer, forming island regions each defined at the periphery thereof by said grooves to a main surface of an active region of said semiconductor substrate or semiconductor layer and insulating and isolating said island regions from each other by a burying material buried in said grooves, comprising:

(a) a step of forming grooves to the main surface of the non-active region of said semiconductor substrate or said semiconductor layer, each groove extending from the surface to the direction of the depth thereof and forming island regions each defined at the periphery thereof with said grooves, to the main surface of the active region of said semiconductor substrate or said semiconductor layer, (b) a step of forming a burying material and a first mask having an etching rate greater as compared with that of the burying material successively over the entire surface of the semiconductor substrate or the semiconductor layer including areas on the upper surface of said island regions, on the lateral sides and the bottoms of said grooves, such that the film thickness is made virtually uniform for each of the surfaces, (c) a step of forming a second mask on the surface of said first mask, through which the region on each of said island regions is opened and in which the end of the opening is situated from the end of said island region to the outside of said island region within a distance 0.7 times of the film thickness for the sum of the burying material and the first mask, and (d) a step of applying isotropic etching successively to each of said first mask and said burying material by using said second mask as an etching mask, under a condition in which the etching rate for the first mask is greater as compared with that for the burying material.

2. A method of manufacturing a semiconductor integrated circuit device as defined in claim 1, wherein the step of forming the grooves to the non-active region of the semiconductor substrate or the semiconductor layer comprises a step of forming said grooves by applying anisotropic etching to the main surface of the non-active region of said semiconductor substrate or said semiconductor layer by using a third mask formed on the main surface of the active region of said semiconductor substrate or said semiconductor layer as an etching mask and, subsequent to the step of forming the groove, introducing an impurity at a higher concentration as compared with an impurity concentration of said semiconductor substrate or said semiconductor layer to the bottom of said grooves on the main surface of said semiconductor substrate or said semiconductor layer by using said third mask as an impurity introduction mask, thereby forming a semiconductor region.

3. A method of manufacturing a semiconductor integrated circuit device as defined in claim 2, wherein the step of forming the semiconductor region to the bottom of the grooves on the main surface of the semiconductor substrate or said semiconductor layer comprises a step of introducing an impurity at a higher concentration as compared with that in said semiconductor substrate or said semiconductor layer to the bottom of said grooves on the main surface of said semiconductor substrate or said semiconductor layer, then applying an extending diffusion treatment to said impurity at high concentration and joining the high concentration impurity in said island regions.

4. A method of manufacturing a semiconductor integrated circuit device of forming grooves to a main surface of an inactive region of a semiconductor substrate or a semiconductor layer, forming island regions each defined at the periphery thereof by said grooves to a main surface of an active region of the said semiconductor substrate or said semiconductor layer and then insulating and isolating said island regions from each other by a burying material buried in said grooves, comprising:

(e) a step of forming an insulating film on the upper surface and the lateral side of said island regions such that the film thickness is made substantially uniform to each of the surfaces, (f) a step of forming a semiconductor region by introducing an impurity of a conduction type identical with that of said semiconductor substrate or said semiconductor layer and at a higher concentration as compared with the impurity concentration therein at a shoulder region where the lateral side and the upper surface of said island region intersects on the main surface of said semiconductor region or said semiconductor layer, through said insulating film by using an ion implantation method at an angle inclined relative to the upper surface of said island region, and (i) a step of forming MISFET to the upper surface of said island regions on the main surface of said semiconductor region or said semiconductor layer.

* * * * *